US012751305B2

(12) United States Patent
Dadvand et al.

(10) Patent No.: US 12,751,305 B2
(45) Date of Patent: Sep. 29, 2026

(54) SUBMOUNTS WITH STUD PROTRUSIONS FOR SEMICONDUCTOR PACKAGES

(71) Applicant: Wolfspeed, Inc., Durham, NC (US)

(72) Inventors: Afshin Dadvand, Durham, NC (US); Devarajan Balaraman, Apex, NC (US)

( * ) Notice: Subject to any disclaimer, the term of this patent is extended or adjusted under 35 U.S.C. 154(b) by 378 days.

(21) Appl. No.: 18/358,616

(22) Filed: Jul. 25, 2023

(65) Prior Publication Data

US 2025/0038055 A1 Jan. 30, 2025

(51) Int. Cl.
*H10W 70/68* (2026.01)
*H10W 70/40* (2026.01)
(Continued)

(52) U.S. Cl.
CPC ......... *H10W 70/68* (2026.01); *H10W 70/417* (2026.01); *H10W 72/01938* (2026.01);
(Continued)

(58) Field of Classification Search
CPC ... H01L 23/49513; H01L 23/13; H01L 24/92; H01L 24/11; H01L 23/49894; H01L 23/49816; H01L 21/563; H01L 23/49822; H01L 25/0657; H01L 2224/0345; H01L 2224/05573; H01L 2224/05624; H01L 2224/05644; H01L 2224/05655; H01L 2224/05664; H01L 2224/26152; H01L 2224/29139; H01L 2224/29147; H01L 2224/29155; H01L 2224/32257; H01L 2224/32258; H01L 2224/48091; H01L 2224/48245; H01L 2224/73265; H01L 2224/0401; H01L 2224/16227; H01L 2224/32225; H01L 2224/73204; H01L 2224/92125; H01L 2224/94; H01L 2924/15311; H01L 2224/16225; H01L 2224/26175; H01L 2224/32145; H01L 2224/48145; H01L 2224/48227; H01L 2224/73253; H01L 2224/8314; H01L 2224/83191; H01L 2224/83385; H01L 2225/06506; H01L 2225/0651;
(Continued)

(56) References Cited

U.S. PATENT DOCUMENTS

| | | | | |
|---|---|---|---|---|
| 10,971,474 | B1 * | 4/2021 | Gandhi | H01L 25/0652 |
| 12,300,568 | B2 * | 5/2025 | Lee | H01L 23/5384 |

(Continued)

FOREIGN PATENT DOCUMENTS

| | | |
|---|---|---|
| DE | 102022128619 A1 | 5/2023 |
| JP | H11-17197 A | 1/1999 |

OTHER PUBLICATIONS

International Search Report and Written Opinion for Application No. PCT/US2024/039281, mailed Nov. 12, 2024, 17 pages.

(Continued)

*Primary Examiner* — Mouloucoulaye Inoussa
(74) *Attorney, Agent, or Firm* — Dority & Manning, P.A.

(57) ABSTRACT

Semiconductor packages are provided. In one example, a semiconductor package includes a submount. The semiconductor package further includes a semiconductor die on the submount. The submount defines a base plane, and the submount includes at least one stud protrusion extending from the base plane in a direction toward the semiconductor die.

32 Claims, 18 Drawing Sheets

(51) Int. Cl.

| | |
|---|---|
| ***H10W 72/00*** | (2026.01) |
| ***H10W 72/30*** | (2026.01) |
| ***H10W 72/90*** | (2026.01) |
| ***H10W 90/00*** | (2026.01) |

(52) U.S. Cl.

CPC .... *H10W 72/073* (2026.01); *H10W 72/07331* (2026.01); *H10W 72/352* (2026.01); *H10W 72/381* (2026.01); *H10W 72/884* (2026.01); *H10W 72/90* (2026.01); *H10W 72/952* (2026.01); *H10W 90/736* (2026.01); *H10W 90/756* (2026.01)

(58) Field of Classification Search

CPC ........... H01L 2225/06562; H01L 2924/00014; H10W 70/68; H10W 70/417; H10W 72/012; H10W 72/90; H10W 72/01908; H10W 72/07252; H10W 72/07254; H10W 72/221; H10W 72/232; H10W 72/234; H10W 72/244; H10W 72/247; H10W 72/248; H10W 72/29; H10W 72/981; H10W 90/724; H10W 70/65; H10W 74/131; H10W 72/07232; H10W 74/15; H10W 90/725

See application file for complete search history.

(56) References Cited

U.S. PATENT DOCUMENTS

| | | | | |
|---|---|---|---|---|
| 12,519,036 | B2 * | 1/2026 | Cho | H10W 20/20 |
| 2005/0013082 | A1 * | 1/2005 | Kawamoto | H05K 3/284 257/E21.511 |
| 2005/0023704 | A1 * | 2/2005 | Lin | H05K 1/111 257/E23.079 |
| 2006/0108671 | A1 * | 5/2006 | Kasem | H01L 23/49548 257/676 |
| 2010/0140800 | A1 * | 6/2010 | Hagihara | H05K 1/113 257/737 |
| 2010/0295174 | A1 * | 11/2010 | Ozawa | H01L 24/17 257/737 |
| 2011/0095418 | A1 * | 4/2011 | Lim | H01L 23/3128 257/737 |
| 2012/0299197 | A1 * | 11/2012 | Kwon | H01L 23/49816 257/777 |
| 2013/0223014 | A1 * | 8/2013 | Lin | B23K 1/0016 361/728 |
| 2014/0199812 | A1 * | 7/2014 | Lin | H01L 21/563 438/127 |
| 2014/0291825 | A1 | 10/2014 | Yoneyama et al. | |
| 2014/0370662 | A1 * | 12/2014 | Nah | H01L 21/563 438/125 |
| 2015/0145129 | A1 * | 5/2015 | Chen | H01L 25/0657 257/737 |
| 2017/0141073 | A1 * | 5/2017 | Lu | H01L 24/81 |
| 2018/0211935 | A1 * | 7/2018 | Liu | H01L 24/81 |
| 2019/0088547 | A1 * | 3/2019 | Chiu | H01L 24/19 |
| 2019/0109018 | A1 * | 4/2019 | Balaraman | H01L 21/4853 |
| 2021/0066179 | A1 * | 3/2021 | Li | H01L 21/6835 |
| 2021/0384100 | A1 * | 12/2021 | Ryu | H01L 23/3675 |
| 2022/0020655 | A1 * | 1/2022 | Cheng | H01L 23/4012 |
| 2022/0028815 | A1 * | 1/2022 | Takaku | H01L 23/49894 |
| 2022/0328952 | A1 * | 10/2022 | Liao | H01L 23/49822 |
| 2022/0336362 | A1 * | 10/2022 | Hsieh | H01L 23/5384 |
| 2022/0352058 | A1 * | 11/2022 | Lee | H01L 23/49816 |
| 2022/0406752 | A1 * | 12/2022 | Wang | H01L 21/78 |
| 2023/0063127 | A1 * | 3/2023 | Huang | H01L 23/3192 |
| 2023/0065429 | A1 * | 3/2023 | Chu | H01L 24/11 |
| 2023/0387063 | A1 * | 11/2023 | Lin | H01L 25/50 |

OTHER PUBLICATIONS

Afshin Dadvand, U.S. Appl. No. 18/169,492, filed Feb. 15, 2023, Electroless Die-Attach Process for Semiconductor Packaging.

* cited by examiner

SUBMOUNTS WITH STUD PROTRUSIONS FOR SEMICONDUCTOR PACKAGES

FIELD

Example aspects of the present disclosure relate generally to semiconductor devices.

BACKGROUND

Semiconductor devices, including power semiconductor devices based on wide bandgap materials, may be formed on a semiconductor wafer as part of a semiconductor fabrication process. The semiconductor wafer may be diced into many individual pieces, each containing one or more semiconductor devices. Each of these pieces may be a semiconductor die. The semiconductor die may need to be attached to other components as part of packaging of the semiconductor device. For instance, a semiconductor die, such as a wide bandgap semiconductor die, may need to be attached to a conductive lead frame for use in a discrete power semiconductor package or a power module. Materials used to attach the semiconductor die to other components may need to provide a thermal, mechanical, and/or electrical connection of the semiconductor die to the other components.

SUMMARY

Aspects and advantages of embodiments of the present disclosure will be set forth in part in the following description, or can be learned from the description, or can be learned through practice of the embodiments.

One example embodiment of the present disclosure is directed to a semiconductor package. The semiconductor package includes a submount and a semiconductor die on the submount. The submount defines a base plane and includes at least one stud protrusion extending from the base plane in a direction toward the semiconductor die.

Another example embodiment of the present disclosure is directed to a semiconductor package. The semiconductor package includes a semiconductor die, a submount defining a base plane, a die-attach material coupling the semiconductor die to the submount, and an encapsulating portion of the semiconductor die. The semiconductor die includes a wide bandgap semiconductor device. The submount includes a plurality of stud protrusions extending from the base plane in a direction toward the semiconductor die.

Another example embodiment of the present disclosure is directed to a submount. The submount includes a surface defining a base plane and at least one stud protrusion. The at least one stud protrusion extends from the base plane.

Another example embodiment of the present disclosure is directed to a method. The method includes placing a semiconductor die on at least one stud protrusion of a submount. The submount defines a base plane.

Another example embodiment of the present disclosure is directed to a semiconductor package. The semiconductor package includes a submount and a semiconductor die on the submount. The semiconductor die includes at least one stud protrusion extending from the semiconductor die in a direction toward the submount.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
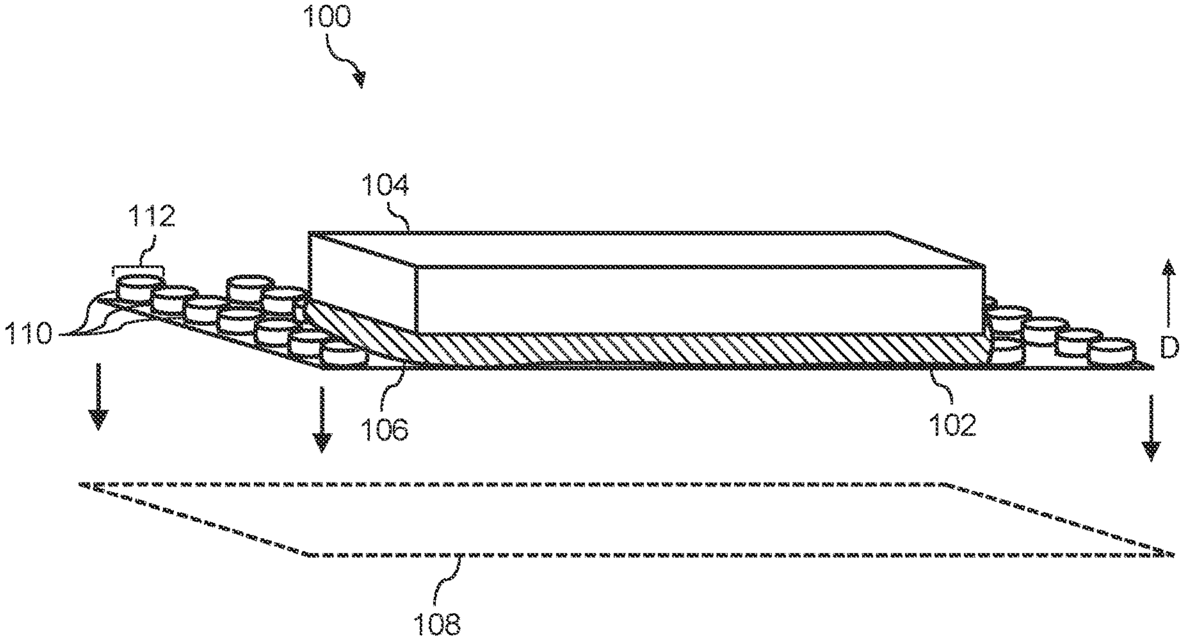
FIG. 1 depicts a perspective view of an example semiconductor package with a semiconductor die attached to a submount using a die-attach material according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to semiconductor packages (e.g., discrete semiconductor packages and power modules) for use in semiconductor applications and other electronic applications. In some embodiments, semiconductor packages may include one or more semiconductor die having at least one semiconductor device. For instance, the semiconductor die may include, e.g., wide bandgap semiconductor devices, silicon carbide-based semiconductor devices (e.g., MOSFETs, Schottky diodes), Group III nitride-based semiconductor devices (e.g., high electron mobility transistor (HEMT) devices), etc.

In some semiconductor packages, one or more semiconductor die may be attached to a submount (e.g., lead frame) using a die-attach material. More particularly, the die-attach material may be deposited on the submount, and the semiconductor die (or other component) may be placed on the die-attach material. The die-attach material may be subjected to bonding or a bonding process (e.g., sintering) to secure the semiconductor die (or other component) to the die-attach material. Various types of die-attach material may be used to bond the one or more semiconductor die to the submount such as, for instance, metal sintering die-attach (e.g., silver (Ag) or copper (Cu)) and conductive adhesive die-attach.

The various technologies that are practiced in the semiconductor industry for die-attach present challenges and limitations. For instance, the uniformity, performance, and reliability of the die-attach material may be adversely affected during the bonding process. In addition, semiconductor packages may experience anomalies and/or failures resulting from deformation, delamination, shifting, moving (e.g., glacial moving) of the various components of the semiconductor package during the bonding process. These anomalies and/or failures may, in turn, affect the electrical, mechanical, and thermal properties of the resulting semiconductor package.

A variety of factors may affect whether these anomalies and/or failures arise during the semiconductor manufacturing process (e.g., the bonding process). Such factors affecting the uniformity, performance, and reliability of the resulting semiconductor package may include the die-attach material and bonding process used during the semiconductor manufacturing process. In addition, the design and structure of the submount may likewise affect the uniformity, performance, and reliability of the die-attach itself. Thus, in addition to the chosen die-attach material, the design and structure of the submount itself plays an important role in the bonding process.

Solutions for preventing the anomalies and/or failures that may arise during the semiconductor manufacturing process may include die-attach material selection and process control (e.g., dispense volume, dispense pattern, die-bond parameters). However, the design and structure of the submount may also be a factor.

Accordingly, example aspects of the present disclosure are directed to a semiconductor package having a submount that defines a base plane. The semiconductor package may further include a semiconductor die on the submount. The submount may include at least one stud protrusion extending from the base plane in a direction toward the semiconductor die. In some embodiments, the stud protrusion(s) may be a punch-defined stud protrusion(s) and may be integral with the submount itself. In other embodiments, the stud protrusion(s) may be prefabricated and attached to the submount. In such embodiments, the prefabricated stud protrusion(s) may be formed from the same material as the submount and/or a different material than the submount.

For instance, in some embodiments, a die-attach film with prefabricated stud protrusion(s) may be placed on the submount prior to depositing the die-attach material. Additionally and/or alternatively, a die-attach film with prefabricated stud protrusion(s) may be placed on a bottom surface of the semiconductor die (e.g., surface facing the submount) prior to depositing the die-attach material. Furthermore, the prefabricated stud protrusion(s) may be printed stud protrusion(s). For instance, in some embodiments, the prefabricated stud protrusion(s) may be formed by, e.g., inkjet printing. More specifically, droplets of a polymer, such as, e.g., Poly(4-vinylphenol), may be deposited on a submount at certain distances. Additionally and/or alternatively, droplets of the polymer (e.g., Poly(4-vinylphenol)) may be deposited on a die-attach film, which is subsequently transferred to the submount. Various parameters (e.g., height, diameter) may be optimized to ensure the droplets and/or stud protrusion(s) are uniformly distributed.

Furthermore, the stud protrusion(s) may include a planar surface, and the semiconductor die may be on the planar surface of the stud protrusion(s). In some embodiments, the planar surface of the stud protrusion(s) may include a circular cross-section, square cross-section, or other suitable shape cross-section. In addition, the submount may include stud protrusion(s) in a center portion of the submount, in a peripheral portion of the submount, and/or both.

As used herein, a "peripheral portion" of the submount includes regions of a surface of the submount that are closer to a perimeter of the surface of the submount relative to a geometric center of surface of the submount. A "center portion" of the submount includes regions of the submount that are closer to a geometric center of the submount relative to a perimeter of the submount.

Example aspects of the present disclosure are further directed to a die-attach process to control and increase uniformity, performance, and reliability of semiconductor packages. The die-attach process may include placing a semiconductor die on at least one stud protrusion of a submount. The submount may define a base plane, and stud protrusion(s) may extend from the base plane in a direction toward the semiconductor die. The die-attach process may further include attaching the semiconductor die to the submount with a die-attach material. In some embodiments, the semiconductor die may be attached to the submount by at least partially filling a space between adjacent stud protrusions with die-attach material and, then, sintering the die-attach material. In other embodiments, an electroless deposition process may be performed to deposit an electroless deposited material to attach the semiconductor die to the submount. In this way, the design and structure of the submount may allow for a variety of different bonding processes and die-attach materials to be used without adversely affecting the uniformity, performance, and reliability of the resulting semiconductor package.

Aspects of the present disclosure are discussed with reference to a die-attach material for attaching a semiconductor die (e.g., a silicon carbide-based semiconductor die, Group III nitride-based semiconductor die, silicon-based semiconductor die, etc.) to a substrate or other component for purposes of illustration and discussion. Those of ordinary skill in the art, using the disclosures provided herein, will understand that the materials provided herein may be used to provide attachment of any suitable components without deviating from the scope of the present disclosure. In this regard, the term "die-attach material" in the disclosure and in the claims is intended to refer to any material that is used to provide thermal, electrical, and/or mechanical connection between two components.

Furthermore, as used herein, "bonding" or "bonding process" refers to causing a transition of a material from a first form to a second form. A bonding process may or may not require attaching a component to the material. Sintering, adhesion, deposition, reflow, annealing, curing, exposing to light, and exposing to ultraviolet light are examples of bonding processes and are encompassed by the term "bonding" or "bonding process" in the disclosure and in the claims.

Aspects of the present disclosure provide a number of technical effects and benefits. For instance, submounts having stud protrusion(s) according to example aspects of the present disclosure provide for greater control during the die-attach process. By including stud protrusion(s) in the submount, example aspects of the present disclosure provide for greater control over, e.g., tilt, fillet height, bond line thickness, shear strength, thermal resistance, etc. Furthermore, submounts having stud protrusion(s) according to example aspects of the present disclosure significantly enhance the reliability and performance of die-attach materials and processes regardless of the type of die-attach material used. Even further, stud protrusion(s) according to example aspects of the present disclosure may be easily formed (e.g., pressed) from both sides of a submount and/or etched from a surface of the submount. In this way, example aspects of the present disclosure provide a cost-effective submount design for use in a uniform, controlled, and reliable die-attach process.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

With reference now to the Figures, example embodiments of the present disclosure will now be set forth.

FIG. 1 depicts a cross-sectional view of at least a portion of a semiconductor package 100 according to example embodiments of the present disclosure. The semiconductor package 100 may include a submount 102. The submount 102 may be, for instance, a lead frame or other supporting structure of a wide bandgap power semiconductor device, such as a silicon carbide-based semiconductor power module or discrete package. The submount 102 may be, for instance, a copper submount 102 or may include other suitable conducting material(s).

The semiconductor package 100 may include a semiconductor die 104, such as a wide bandgap semiconductor die 104. The semiconductor die 104 may include one or more devices, such as one or more of a wide variety of power devices available for different applications including, for example, power switching devices and/or power amplifiers. In some embodiments, the semiconductor die 104 may include one or more transistor devices, such as field effect transistors (FET) devices, including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally diffused metal-oxide semiconductor) transistor devices, etc. In some embodiments, the semiconductor die 104 may include one or more diodes (e.g., Schottky diodes, light emitting diodes, etc.).

In some embodiments, the semiconductor die 104 may be fabricated from wide bandgap semiconductor materials (e.g., having a band gap greater than 1.40 eV). For high power, high temperature, and/or high frequency applications, devices formed in wide bandgap semiconductor materials such as silicon carbide (e.g., 2.996 eV band gap for alpha silicon carbide at room temperature) and/or the Group III-nitrides (e.g., 3.36 eV band gap for gallium nitride at room temperature) may provide higher electric field breakdown strengths and higher electron saturation velocities. For instance, in some embodiments, the semiconductor die 104 may include a wide bandgap semiconductor device such as, e.g., a silicon carbide-based MOSFET or a silicon carbide-based Schottky diode. Additionally and/or alternatively, the semiconductor die 104 may include a wide bandgap semiconductor device such as, e.g., a Group III nitride-based high electron mobility transistor (HEMT).

Aspects of the present disclosure are discussed with reference to wide bandgap semiconductors for purposes of illustration and discussion. Those of ordinary skill in the art, using the disclosures provided herein, will understand that the submounts and die-attach materials according to example embodiments of the present disclosure may be used with any semiconductor material or other material without deviating from the scope of the present disclosure.

As will be discussed in greater detail below, the semiconductor die 104 may be attached to the submount 102 using a sintering die-attach process (e.g., FIG. 8) and/or an electroless die-attach process (e.g., FIG. 10). More specifically, the semiconductor die 104 may be attached to the submount 102 using a die-attach material 106. The die-attach material 106 may be placed on a surface of the submount 102, on a surface of the semiconductor die 104, or both a surface of the submount 102 and a surface of the semiconductor die 104. In some embodiments, the semiconductor package 100 may include a die-attach material 106 between at least a portion of the semiconductor die 104 and at least a portion of the submount 102. The die-attach material 106 may include, for instance, solder, paste, sintered metal, etc. For instance, the die-attach material 106 may include a sintered metal such as, e.g., copper sintered metal and/or silver sintered metal.

Furthermore, the submount 102 may define a base plane 108. The base plane 108 is a plane that intersects multiple portions of a lowermost surface of the submount 102 and extends to a perimeter of the submount 102. In FIG. 1, the base plane 108 is illustrated below the lower surface of the submount 102 for purposes of illustration and discussion. However, it should be appreciated that the base plane 108 is co-planar with portions of the lower surface of the submount 102.

As will be discussed in greater detail below, the submount 102 may include at least one stud protrusion 110 extending from the base plane 108 in a direction D toward the semiconductor die 104. The at least one stud protrusion 110 may be formed in the submount 102 using, e.g., a punch tool or other suitable tool. In some embodiments, the at least one stud protrusion 110 may be prefabricated and attached to the submount 102. The stud protrusions 110 may have a height in a range of about 1 micron to about 20 microns, such as about 2 microns to about 15 microns, such as about 3 microns to about 10 microns. Furthermore, the at least one stud protrusion 110 may be integral with the submount 102. For instance, in some embodiments, the at least one stud protrusion 110 may be a punch-defined stud protrusion 110. Additionally and/or alternatively, the at least one stud protrusion 110 may be an annular stud protrusion 110. Furthermore, the submount 102 may include at least one stud protrusion 110 in a center portion of the submount 102 and/or in a peripheral portion of the submount 102. In other embodiments, the at least one stud protrusion 110 may be prefabricated and attached to the submount 102. In such embodiments, the prefabricated stud protrusion(s) 110 may be formed from the same material as the submount 102 and/or a different material than the submount 102.

For instance, in some embodiments, a die-attach film with prefabricated stud protrusion(s) 110 may be placed on the submount 102 prior to depositing the die-attach material 106. Additionally and/or alternatively, a die-attach film with prefabricated stud protrusion(s) 110 may be placed on a bottom surface of the semiconductor die 104 (e.g., surface facing the submount 102) prior to depositing the die-attach material 106. Furthermore, the prefabricated stud protrusion(s) 110 may be printed stud protrusion(s) 110. For instance, in some embodiments, the prefabricated stud protrusion(s) 110 may be formed by, e.g., inkjet printing. More specifically, droplets of a polymer, such as, e.g., Poly(4-vinylphenol), may be deposited on the submount 102 at certain distances and locations. Additionally and/or alternatively, droplets of the polymer (e.g., Poly(4-vinylphenol)) may be deposited on a die-attach film, which is subsequently transferred to the submount 102. Various parameters (e.g., height, diameter) may be optimized to ensure the droplets and/or stud protrusion(s) 110 are uniformly distributed.

In some embodiments, the submount 102 may include a plurality of stud protrusions 110. In such embodiments, at least one of the stud protrusions 110 may be in the center portion of the submount 102 and at least one of the stud protrusions 110 may be in the peripheral portion of the submount 102. In this manner, the submount 102 may include a plurality of stud protrusions 110 arranged in an array on the submount 102. It should be noted that the stud protrusions 110 may be arranged in any suitable manner on submount 102 without deviating from the scope of the present disclosure.

Furthermore, as shown, the at least one stud protrusion 110 may include a planar surface 112. In some embodiments, the semiconductor die 104 may be arranged on the planar surface 112 of at least one stud protrusion 110. In this manner, the semiconductor die 104 may be directly on at least one stud protrusion 110. A surface area of the planar surface 112 may be less than about ten percent (10%) of a surface area of the base plane 108 defined by the submount 102. Furthermore, in some embodiments, the surface area of the planar surface 112 may be less than about five percent (5%) of the surface area of the base plane 108 defined by the submount 102.

As will be discussed in greater detail below, in some embodiments, the planar surface 112 of the at least one stud protrusion 110 may include a circular cross-section. Additionally and/or alternatively, the planar surface 112 may include a square cross-section. It should be noted that the planar surface 112 may include any suitable shape cross-section without deviating from the scope of the present disclosure, such as a polygon shaped cross-section, oval cross-section, irregular shape cross-section, etc.

Figure 2:
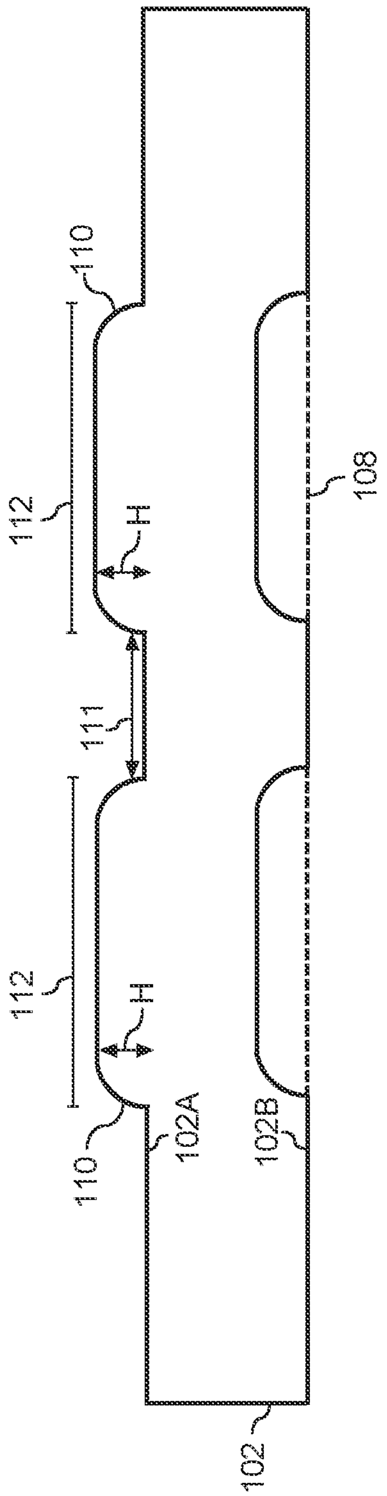
FIG. 2 depicts a cross-sectional view of an example submount with stud protrusions according to example embodiments of the present disclosure.
Figure 3:
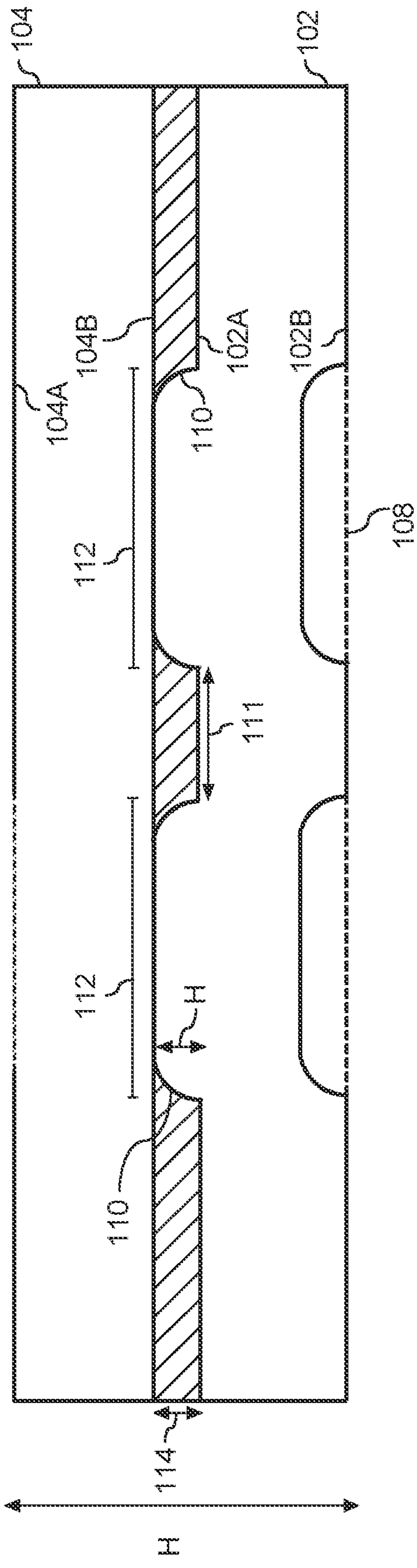
FIG. 3 depicts a cross-sectional view of an example semiconductor die attached to an example submount with stud protrusions according to example embodiments of the present disclosure.

FIGS. 2-3 depict close-up views of the submount 102 discussed above with reference to FIG. 1. FIG. 2 depicts a cross-sectional view of the example submount 102 of FIG. 1, and FIG. 3 depicts a cross-sectional view of at least a portion of the example semiconductor package 100 of FIG. 1. As noted above, the submount 102 may be a conductive lead frame. Additionally, the submount 102 may include copper. Furthermore, the submount 102 may define a base plane 108.

Referring to FIG. 2, the submount 102 may include a top surface 102A and a bottom surface 102B. Furthermore, as noted above, the submount 102 may include stud protrusions 110 extending from the base plane 108 (defined by the submount 102) in a direction D toward the semiconductor die 104 (FIG. 3). In some embodiments, a height H of the stud protrusions 110 may be in a range of about 1 micron to about 20 microns, such as about 2 microns to about 15 microns, such as about 3 microns to about 10 microns.

Furthermore, the stud protrusions 110 may include a planar surface 112 that can have any suitable shape cross-section such as, e.g., a circular cross-section or a square cross-section. In some embodiments, a surface area of the planar surface 112 may be less than about ten percent (10%) of a surface area of the base plane 108 defined by the submount 102. Additionally and/or alternatively, a surface area of the planar surface 112 may be less than about five percent (5%) of a surface area of the base plane 108 defined by the submount 102.

As shown, the stud protrusions 110 may be integral with the submount 102. In some embodiments, at least one stud protrusion 110 may be in a center portion of the submount 102 and/or a peripheral portion of the submount 102. Furthermore, the stud protrusions 110 may be formed using a variety of different techniques. For instance, in some embodiments, the stud protrusions 110 may be punch-defined stud protrusions 110 and/or annular stud protrusions 110. Additionally and/or alternatively, in some embodiments, the stud protrusions 110 may be prefabricated and attached to the submount 102. More particularly, the stud protrusions 110 may be formed (e.g., pressed) from the bottom surface 102B of submount 102. Alternatively, the stud protrusions 110 may be etched from the top surface 102A and/or the bottom surface 102B.

In some embodiments, the submount 102 may include a plurality of stud protrusions 110. The plurality of stud protrusions 110 may be arranged in an array. Each of the plurality of stud protrusions 110 may extend from the base plane 108 (defined by the submount 102) in the direction D toward the semiconductor die 104. In embodiments with a plurality of stud protrusions 110, a space 111 may be formed between adjacent stud protrusions 110.

Aspects of the present disclosure are discussed with reference to stud protrusion(s) 110 on a single surface of the submount 102 for purposes of illustration and discussion. However, it should be appreciated that aspects of the present disclosure may include stud protrusion(s) 110 on multiple surfaces of the submount 102 without deviating from the scope of the present disclosure.

Referring now to FIG. 3, as discussed above, the semiconductor package 100 may include a die-attach material 106 coupling the semiconductor die 104 to the submount 102. That is, the semiconductor package 100 may include die-attach material 106 between at least a portion of the semiconductor die 104 and at least a portion of the submount 102. For instance, as shown in FIG. 3, the die-attach material 106 fills the space 111 between adjacent stud protrusions 110 of a plurality of stud protrusions 110 on the submount 102. In some embodiments, the die-attach material 106 may include a sintered material such as, e.g., sintered silver or sintered copper. Additionally and/or alternatively, in some embodiments, the die-attach material 106 may include an electroless deposited material.

Furthermore, a height of the die-attach material 106 along a thickness direction T may define a bond line thickness (BLT) 114 of the semiconductor package 100. More specifically, as shown in FIG. 3, the semiconductor die 104 may include a top surface 104A and a bottom surface 104B that is opposite the top surface 104A. The BLT 114 may be measured from the top surface 102A of the submount 102 to a bottom surface 104B of the semiconductor die 104. In some embodiments, the semiconductor package 100 may have a BLT 114 that is substantially equal to the height H of the stud protrusions 110 which, as noted above, may be in a range of about 1 micron to about 20 microns, such as about 2 microns to about 15 microns, such as about 3 microns to about 10 microns. Thus, according to example aspects of the present disclosure, the semiconductor package 100 may have a BLT 114 in a range of about 1 micron to about 20 microns, such as about 2 microns to about 15 microns, such as about 3 microns to about 10 microns.

Example aspects of the present disclosure provide for greater control of BLT and tilt during the semiconductor manufacturing process. For instance, the BLT 114 (FIG. 3) may be controlled by adjusting a height of the stud protrusions 110 during the semiconductor manufacturing process. More specifically, to increase the BLT 114 (FIG. 3), the height of the stud protrusions 110 may be increased. Likewise, to decrease the BLT 114 (FIG. 3), the height of the stud protrusions 110 may be decreased. Furthermore, tilt of the semiconductor die 104 may be controlled by adjusting a height of each stud protrusion 110 individually. For instance, in embodiments with no tilt, each stud protrusion 110 may be the same height. Alternatively, in embodiments with intentional tilt, a direction and degree of the tilt may be controlled by varying respective heights of individual stud protrusions 110 on the submount 102.

Figure 4A:
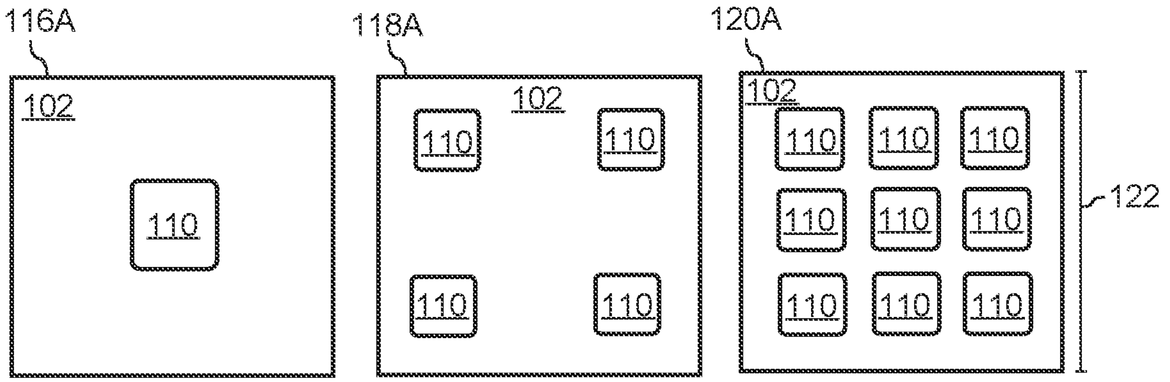
FIG. 4A depicts a top view of example stud protrusion configurations on an example submount according to example embodiments of the present disclosure.
Figure 4B:
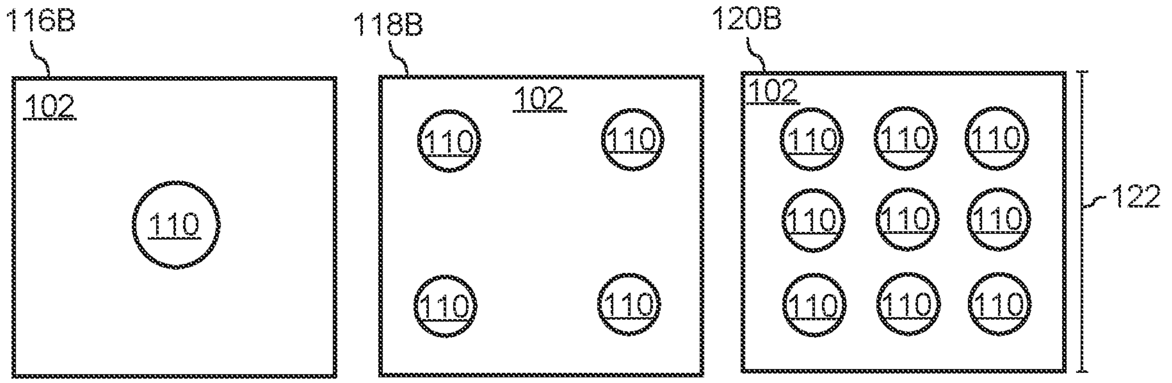
FIG. 4B depicts a top view of example stud protrusion configurations on an example submount according to example embodiments of the present disclosure.

FIGS. 4A-4B depict cross-sectional top views of the example submount 102 with various example configurations of at least one stud protrusion 110. As noted above, the submount 102 may include at least one stud protrusion 110 extending from the base plane 108 (defined by the submount 102) (FIGS. 1-3) in a direction toward the semiconductor die 104 (FIGS. 1-3). Furthermore, each stud protrusion 110 may include a planar surface 112 (FIGS. 1-3), and the planar surface 112 may include any suitable shape cross-section such as, e.g., a square cross-section or a circular cross-section.

For instance, FIG. 4A depicts example stud protrusion configurations 116A, 118A, 120A with at least one stud protrusion 110 having a square cross-section. Alternatively, FIG. 4B depicts example stud protrusion configurations

116B, 118B, 120B with at least one stud protrusion 110 having a circular cross-section. It should be noted that the stud protrusions 110 may have any suitable shape cross-section without deviating from the scope of the present disclosure.

Furthermore, in some embodiments, the submount 102 may include at least one stud protrusion 110 in a center portion of the submount 102. For instance, as shown in example configurations 116A (FIG. 4A) and 116B (FIG. 4B), the stud protrusion 110 may be formed in a center portion of the substrate. Additionally and/or alternatively, in some embodiments, the submount 102 may include at least one stud protrusion 110 in a peripheral portion of the submount 102. For instance, as shown in example configurations 118A (FIG. 4A) and 118B (FIG. 4B), the stud protrusions 110 may be formed in a peripheral portion of the substrate.

As discussed above, in some embodiments, the submount 102 may include a plurality of stud protrusions 110 arranged in an array 122 on the submount 102. More specifically, the submount 102 may include at least one stud protrusion 110 of the plurality of stud protrusions 110 in a center portion of the submount and at least one stud protrusion 110 of the plurality of stud protrusions 110 in a peripheral portion of the submount. For instance, as shown in example configurations 120A (FIG. 4A) and 120B (FIG. 4B), a plurality of stud protrusions 110 may be arranged in an array 122 on submount 102. Furthermore, each array 122 includes at least one stud protrusion 110 in a center portion of the submount 102 and at least one stud protrusion 110 in a peripheral portion of the submount 102.

FIGS. 4A-4B depict example stud protrusion configurations according to example embodiments of the present disclosure. It should be appreciated that submounts according to example aspects of the present disclosure may have any number of stud protrusions without deviating from the scope of the present disclosure. The number and configuration of stud protrusions in FIGS. 4A-4B are provided for purposes of illustration and discussion.

Figure 5:
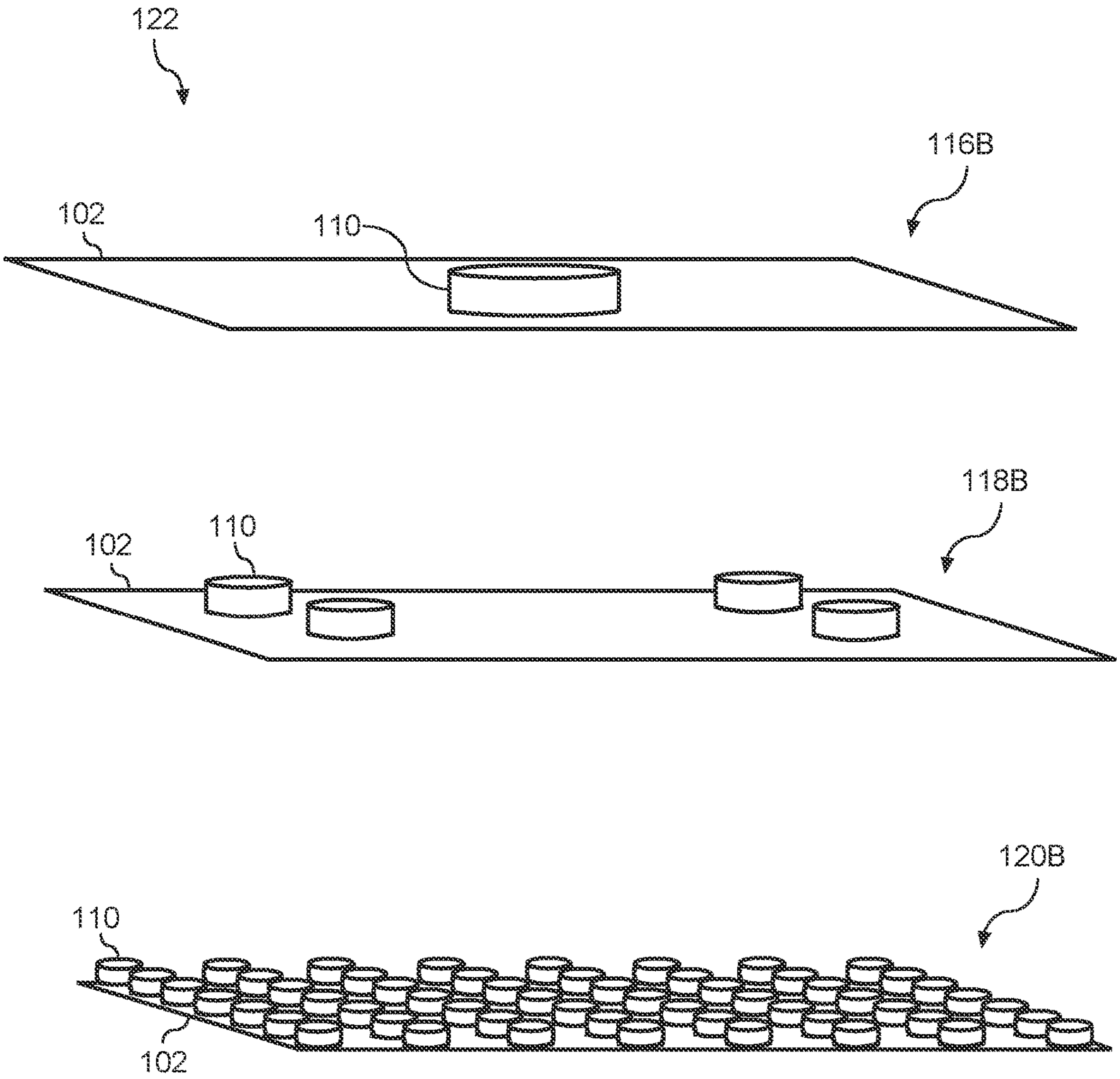
FIG. 5 depicts a perspective top view of the example stud protrusion configurations on the example submount of FIG. 4B according to example embodiments of the present disclosure.

Referring now to FIG. 5, a perspective top view of the example stud protrusion configurations depicted in FIG. 4B is provided. More particularly, example configuration 116B depicts a stud protrusion 110 (with a circular cross-section) in a center portion of the submount 102. Furthermore, example configuration 118B depicts a plurality of stud protrusions 110 (each with a circular cross-section) in a peripheral portion of the submount 102. Even further, example configuration 120B depicts a plurality of stud protrusions 110 (each with a circular cross-section) arranged in an array 122 in a center portion and peripheral portion of the submount 102.

Figure 6:
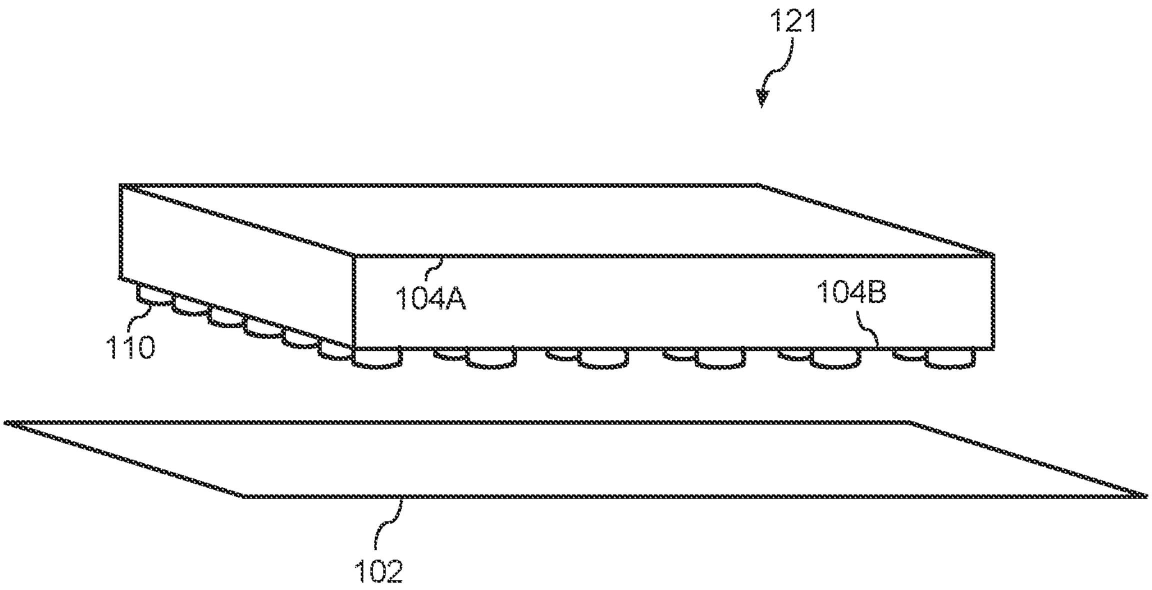
FIG. 6 depicts an exploded, perspective view of an example semiconductor package with an example stud protrusion configuration on a semiconductor die according to example embodiments of the present disclosure.

FIG. 6 depicts an exploded, perspective view of an example stud protrusion 121 configuration on an example semiconductor die 104. In some embodiments, the semiconductor die 104 may include at least one stud protrusion 110 extending from the semiconductor die 104 toward the submount 102. More particularly, as shown, the at least one stud protrusion 110 may extend from a bottom surface 104B of the semiconductor die 104 toward the submount 102. In some embodiments, the at least one stud protrusion 110 may be prefabricated and attached to the bottom surface 104B of the semiconductor die 104. Furthermore, as noted above, the stud protrusion(s) 110 may have a height in a range of about 1 micron to about 20 microns, such as about 2 microns to about 15 microns, such as about 3 microns to about 10 microns.

Similar to the configurations discussed above with reference to FIGS. 1-5, the at least one stud protrusion 110 may include a planar surface 112. In some embodiments, the submount 102 may be arranged on the planar surface 112 of the at least one stud protrusion 110. In this manner, the submount 102 may directly contact the planar surface 112 of the at least one stud protrusion 110. A surface area of the planar surface 112 may be less than about ten percent (10%) of a surface area of the submount 102. Furthermore, in some embodiments, the surface area of the planar surface 112 may be less than about five percent (5%) of a surface area of the submount 102.

Furthermore, it should be noted that the stud protrusions 110 may be configured on the bottom surface 104B of the semiconductor die 104 in a similar manner as depicted in FIGS. 4A-5. That is, the stud protrusions 110 may have a square cross-section, a circular cross-section, and/or any suitable shape cross-section. Additionally, the semiconductor die 104 may include at least one stud protrusion 110 in a center portion of the bottom surface 104B of the semiconductor die 104 and/or at least one stud protrusion 110 in a peripheral portion of the bottom surface 104B of the semiconductor die 104.

In some embodiments, the semiconductor die 104 may include a plurality of stud protrusions 110 arranged in an array on the bottom surface 104B of the semiconductor die 104. In such embodiments, as will be discussed in greater detail below, die-attach material and/or electroless deposited material may be disposed between at least a portion of the semiconductor die 104 and the submount 102. More particularly, the die-attach material and/or electroless deposited material may partially fill a space between adjacent stud protrusions 110 on the bottom surface 104B of the semiconductor die 104.

It should be appreciated that semiconductor die according to example aspects of the present disclosure may have any number of stud protrusions without deviating from the scope of the present disclosure. The number and configuration of stud protrusions in FIG. 6 are provided for purposes of illustration and discussion.

Figure 7:
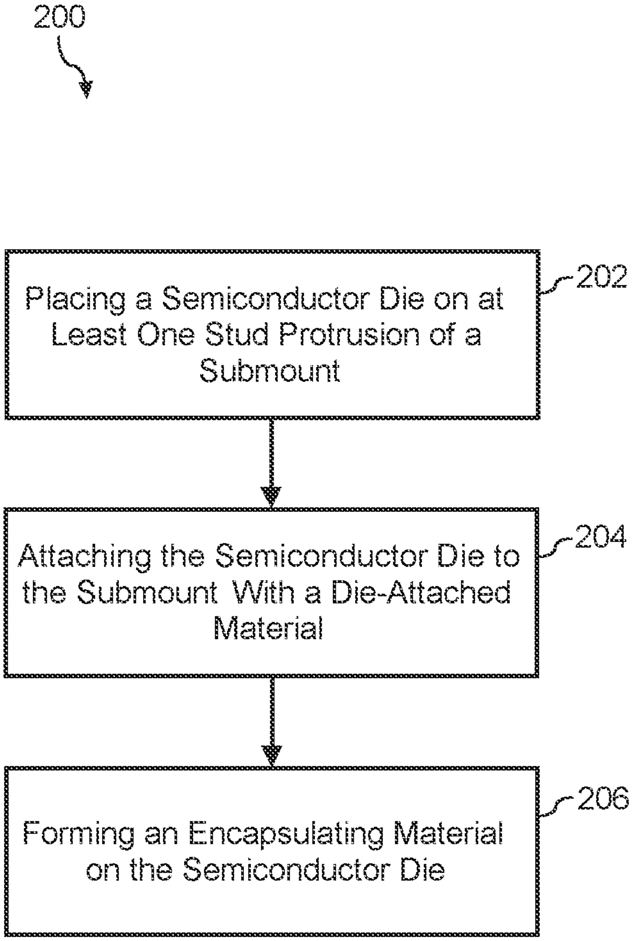
FIG. 7 depicts a flow chart diagram of an example method according to example embodiments of the present disclosure.

FIG. 7 depicts a flow chart diagram of an example method 200 according to example embodiments of the present disclosure. FIG. 7 depicts example method steps for purposes of illustration and discussion. Those of ordinary skill in the art, using the disclosures provided herein, will understand that the methods described in the present disclosure may be adapted, modified, include steps not illustrated, omitted, and/or rearranged without deviating from the scope of the present disclosure.

At (202), the method 200 may include placing a semiconductor die on at least one stud protrusion of a submount. More particularly, the submount (e.g., lead frame) may define a base plane. In some embodiments, the submount may include copper. The submount may further include at least one stud protrusion extending from the base plane in a direction toward the semiconductor die. As discussed above, the semiconductor die may include silicon carbide-based devices (e.g., silicon carbide-based MOSFETs, silicon carbide-based Schottky diodes) and/or Group III nitride-based devices (e.g., Group III nitride-based high electron mobility transistors (HEMTs)).

Furthermore, as discussed above, the at least one stud protrusion may have a height in a range of about 1 micron to about 20 microns, such as about 2 microns to about 15 microns, such as about 3 microns to about 10 microns. Additionally, in some embodiments, the at least one stud protrusion may be in a center portion of the submount.

Additionally and/or alternatively, the at least one stud protrusion may be in a peripheral portion of the submount. In some embodiments, the submount may include at least one stud protrusion in the center portion of the submount and at least one stud protrusion in the peripheral portion of the submount. For instance, as discussed above, the submount may include a plurality of stud protrusions arranged in an array on the submount.

Furthermore, the at least one stud protrusion may include a planar surface. In some embodiments, a surface area of the planar surface may be less than about ten percent (10%) of a surface area of the base plane defined by the submount. In other embodiments, a surface area of the planar surface may be less than about five percent (5%) of a surface area of the base plane defined by the submount.

Furthermore, as discussed above with reference to FIG. 4A, the planar surface of the at least one stud protrusion may include a square cross-section. Additionally and/or alternatively, as discussed above with reference to FIG. 4B, the planar surface of the at least one stud protrusion may include a circular cross-section. It should be noted that the planar surface may have any suitable shaped cross-section without deviating from the scope of the present disclosure.

Referring to FIG. 7 at (204), the method 200 may include attaching the semiconductor die to the submount with a die-attach material. As discussed above, the semiconductor die may be attached to the submount using a variety of die-attach processes such as, e.g., a sintering die-attach process or an electroless die-attach process.

Figure 8:
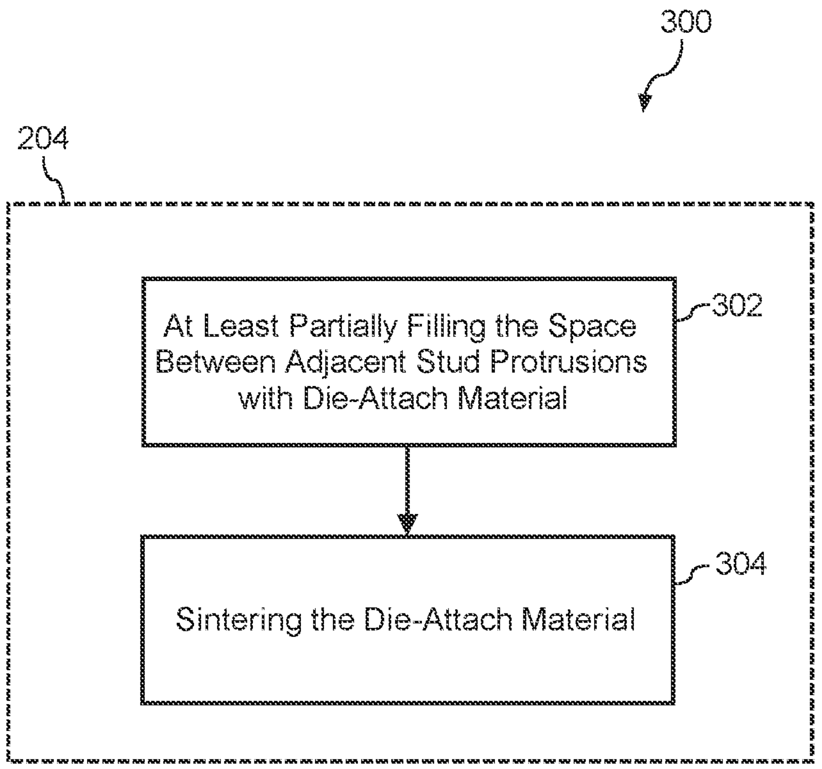
FIG. 8 depicts a flow chart diagram of an example method according to example embodiments of the present disclosure.

As an illustrative example, FIG. 8 depicts a flow chart diagram of an example sintering die-attach method 300 for attaching the semiconductor die to the submount with the die-attach material at (204). FIG. 8 depicts example method steps for purposes of illustration and discussion. Those of ordinary skill in the art, using the disclosures provided herein, will understand that the methods described in the present disclosure may be adapted, modified, include steps not illustrated, omitted, and/or rearranged without deviating from the scope of the present disclosure.

Referring to FIG. 8 at (302), attaching the semiconductor die to the submount with the die-attach material at (204) may include at least partially filling a space between adjacent stud protrusions with die-attach material. As noted above, the die-attach material may be any suitable sintered material such as, e.g., sintered silver and/or sintered copper.

Figure 9A:
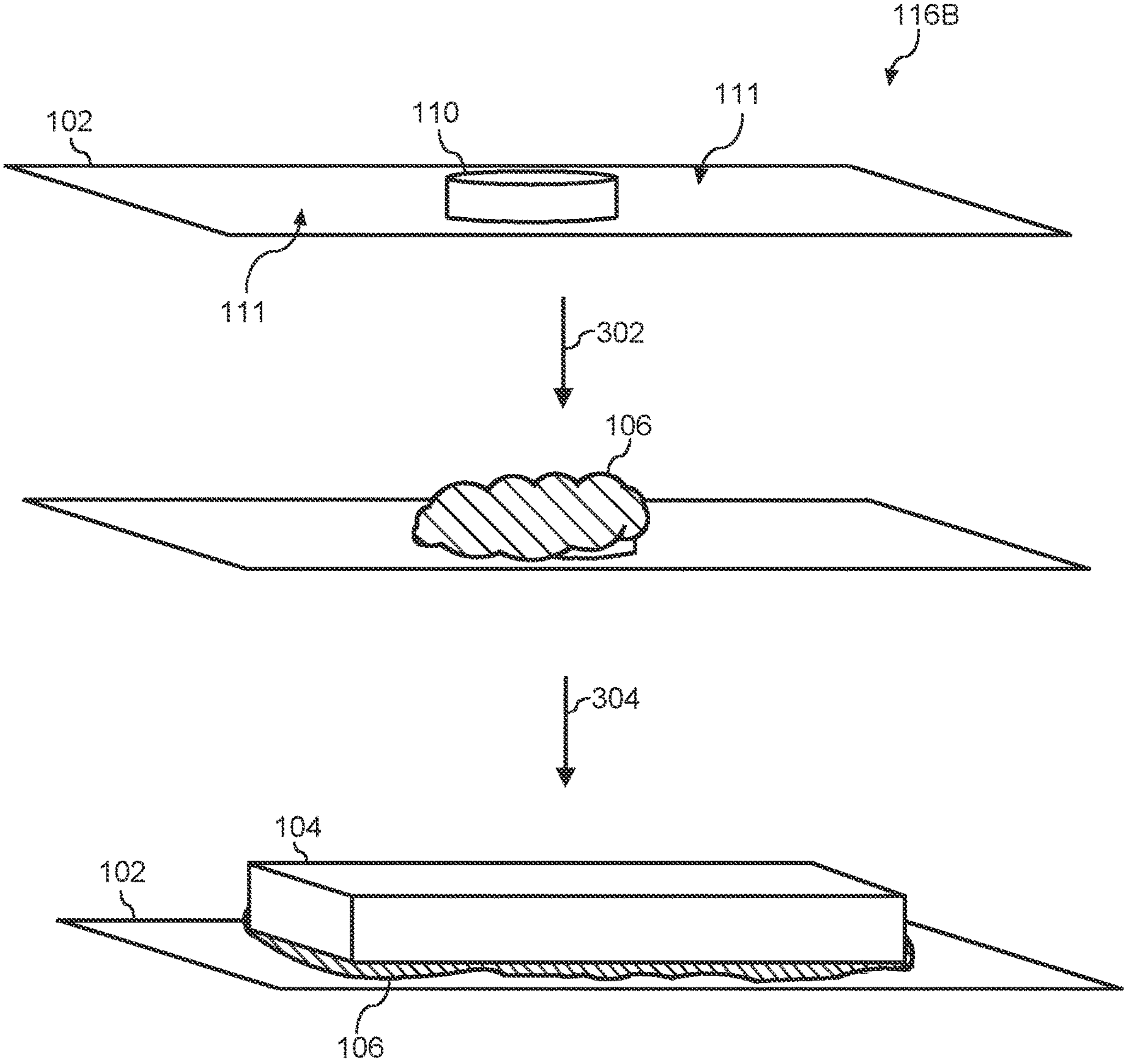
FIGS. 9A-9C depict illustrative examples of the example method of FIG. 8 according to example embodiments of the present disclosure.
Figure 9B:
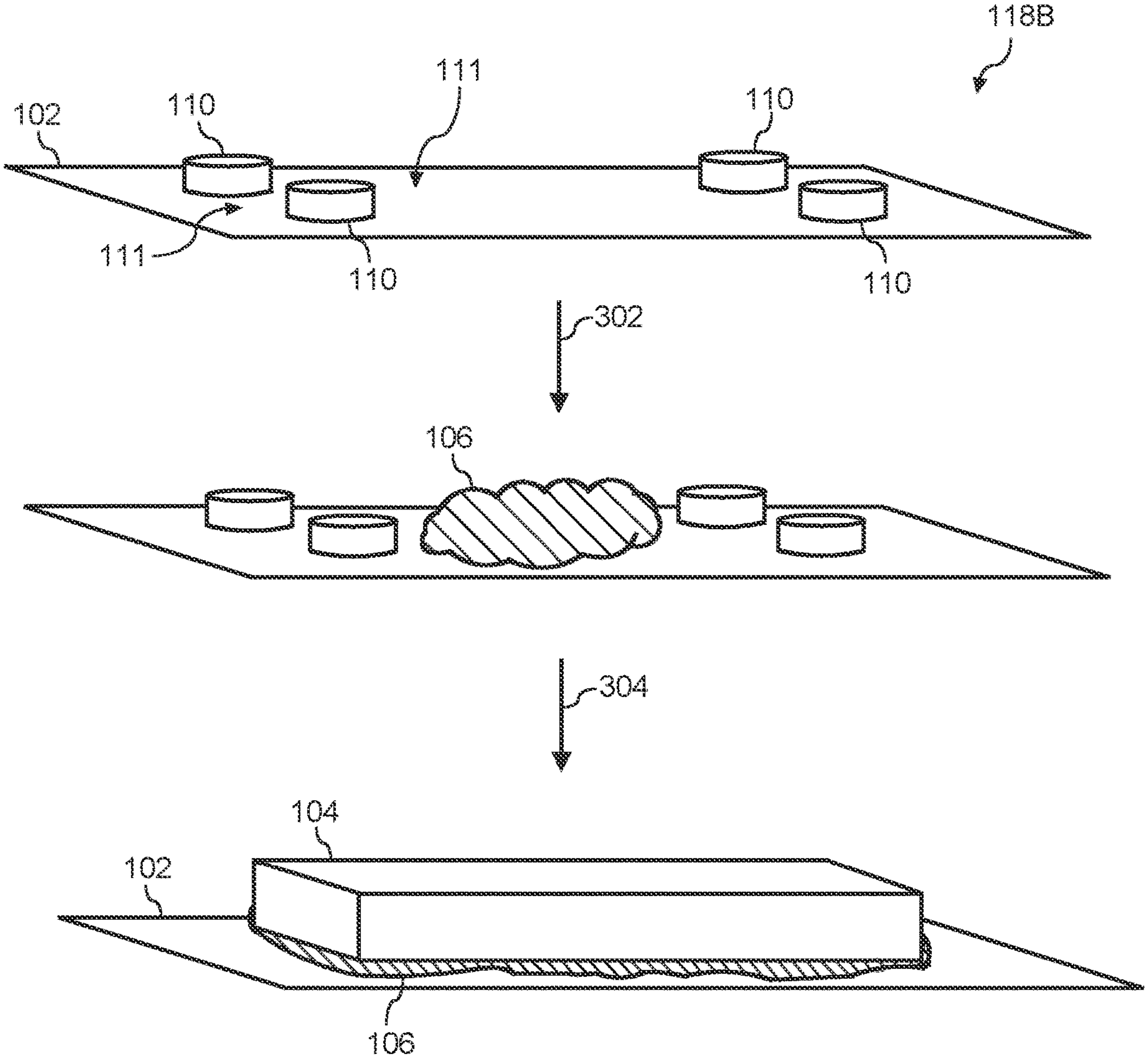
Figure 9C:
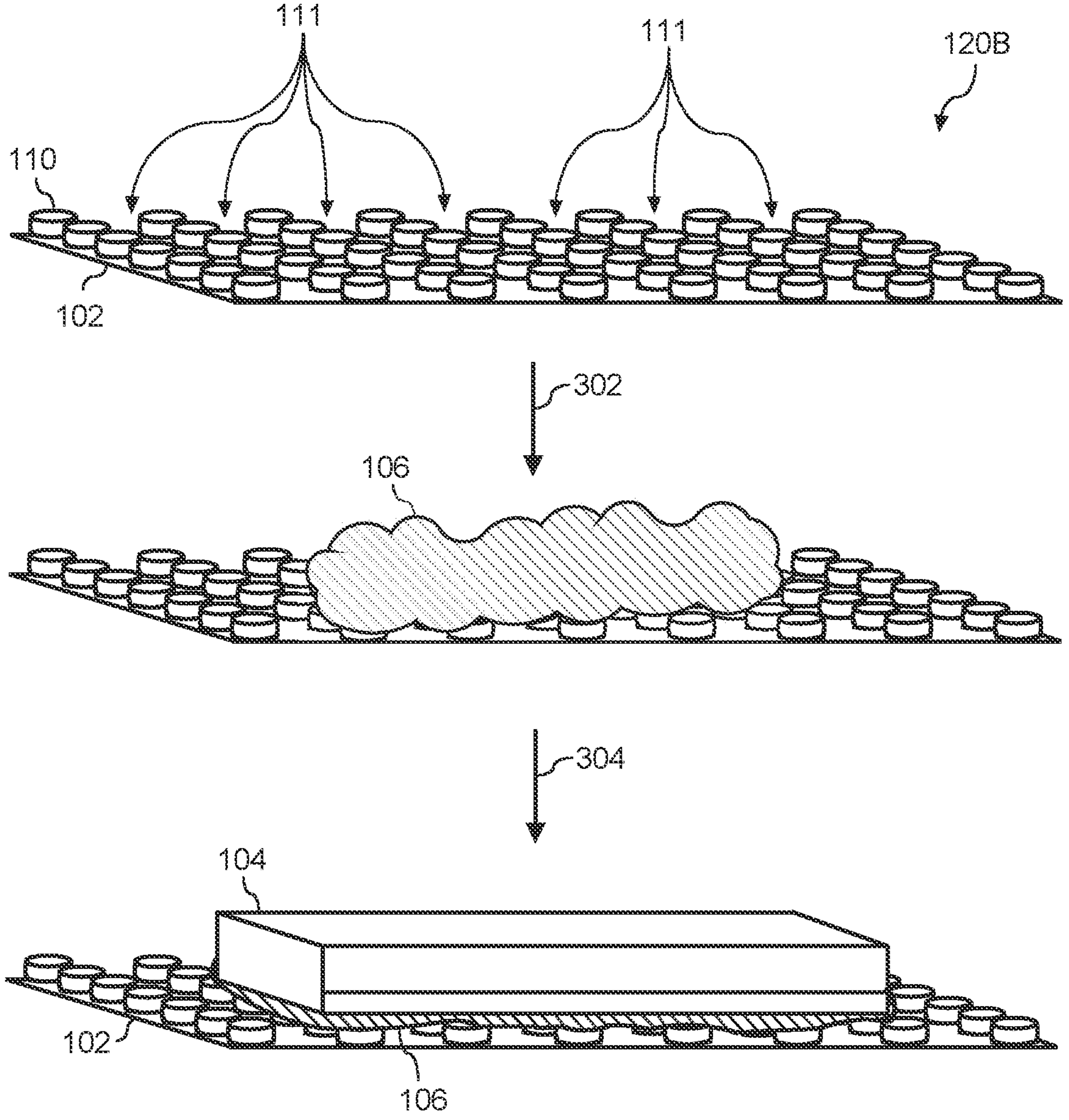

FIGS. 9A-9C depict aspects of a sintering die-attach process according to example embodiments of the present disclosure. More particularly, FIG. 9A depicts the example sintering die-attach method 300 for attaching a semiconductor die 104 to a submount 102 having the example configuration 116B as depicted in FIG. 5. Furthermore, FIG. 9B depicts the example sintering die-attach method 300 for attaching a semiconductor die 104 to a submount 102 having the example configuration 118B as depicted in FIG. 5. Finally, FIG. 9C depicts the example sintering die-attach method 300 for attaching a semiconductor die 104 to a submount 102 having the example configuration 120B as depicted in FIG. 5. It should be appreciated that FIGS. 9A-9C depict example configurations 116B, 118B, 120B for purposes of illustration and discussion.

Referring to FIGS. 9A-9C, as represented by arrow 302, a space 111 between stud protrusions 110 on submount 102 may be filled with die-attach material 106. The die-attach material 106 may be a sintered material such as, e.g., sintered silver or sintered copper.

Referring to FIG. 8 at (304), attaching the semiconductor die to the submount with the die-attach material at (204) may further include sintering the die-attach material. In this manner, by sintering the die-attach material, the die-attach material may couple the semiconductor die to the submount.

Referring again to FIGS. 9A-9C, as represented by arrow 304, the die-attach material 106 may be sintered, thereby coupling the semiconductor die 104 to the submount 102. For instance, as shown, the semiconductor die 104 may be placed on at least one stud protrusion 110 of the submount 102. In this manner, the semiconductor die 104 may be coupled to the submount 102 with the die-attach material 106.

Figure 10:
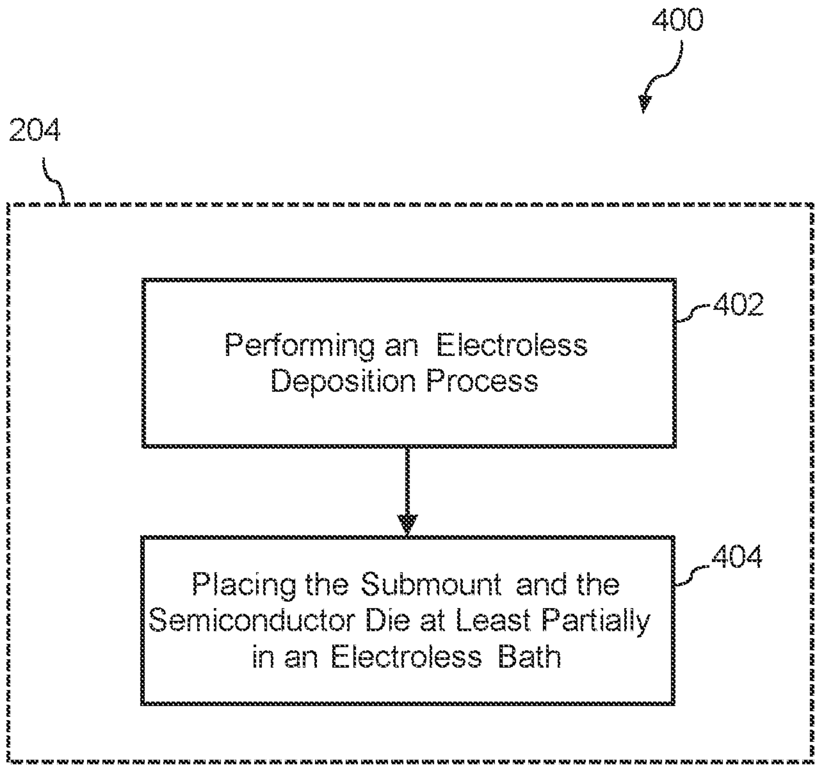
FIG. 10 depicts a flow chart diagram of an example method according to example embodiments of the present disclosure.

As an alternative illustrative example, FIG. 10 depicts a flow chart diagram of an example electroless die-attach method 400 for attaching the semiconductor die to the submount with the die-attach material at (204). FIG. 10 depicts example method steps for purposes of illustration and discussion. Those of ordinary skill in the art, using the disclosures provided herein, will understand that the methods described in the present disclosure may be adapted, modified, include steps not illustrated, omitted, and/or rearranged without deviating from the scope of the present disclosure.

Referring to FIG. 10 at (402), attaching the semiconductor die to the submount with the die-attach material at (204) may include performing an electroless deposition process to deposit an electroless deposited material. As will be discussed in greater detail below, the electroless deposition process may include depositing a catalytic layer on the submount. Additionally and/or alternatively, the electroless deposition process may include depositing a catalytic layer on the semiconductor die. Additionally and/or alternatively, the electroless deposition process may include depositing a catalytic layer on both the submount and the semiconductor die. Furthermore, the electroless deposition process may include depositing electroless deposited material on the catalytic layer. It should be noted that, as used herein, "catalytic layer" and "conductive catalytic layer" are used interchangeably.

Figure 11A:
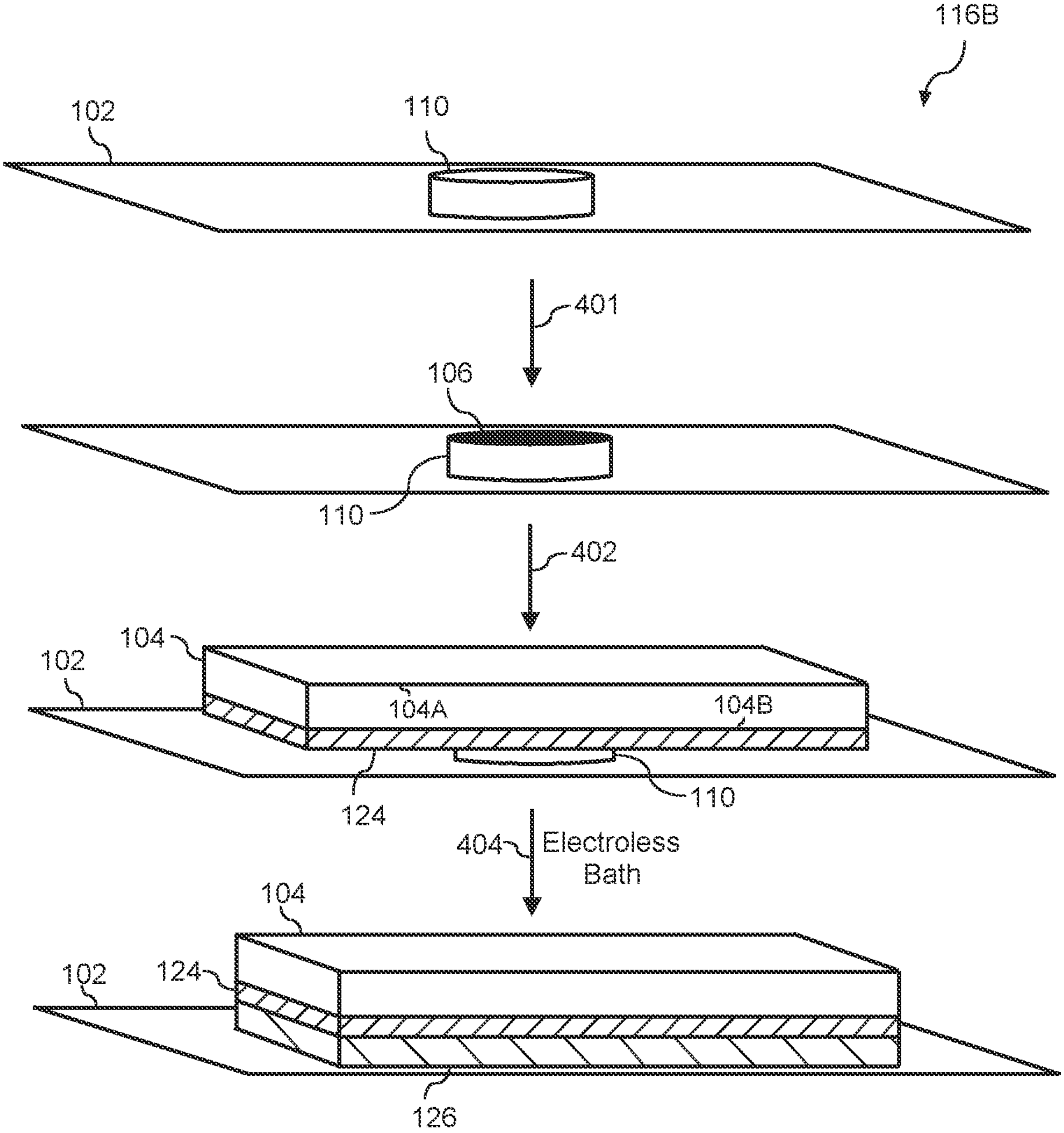
FIGS. 11A-11C depict illustrative examples of the example method of FIG. 10 according to example embodiments of the present disclosure.
Figure 11B:
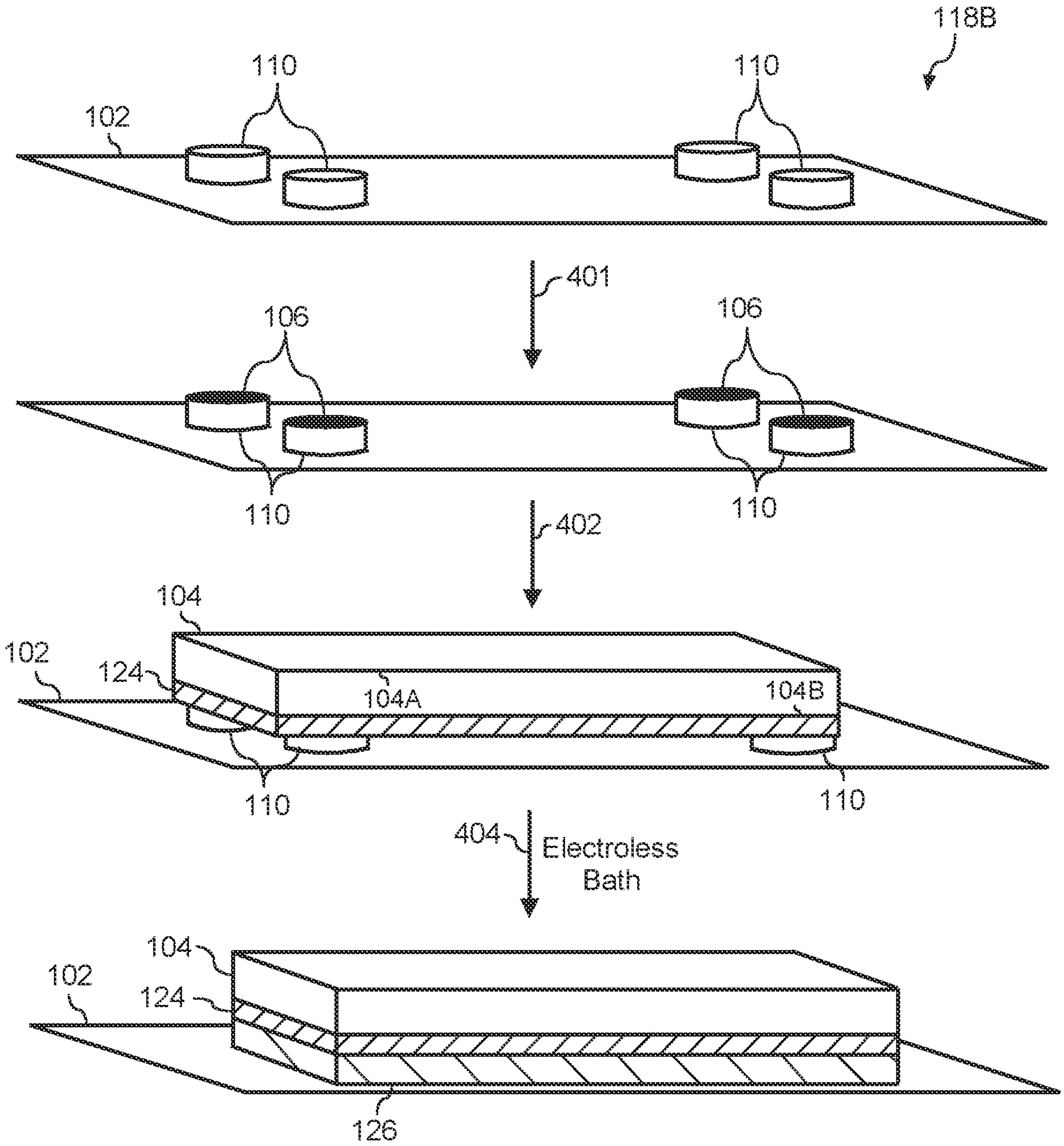
Figure 11C:
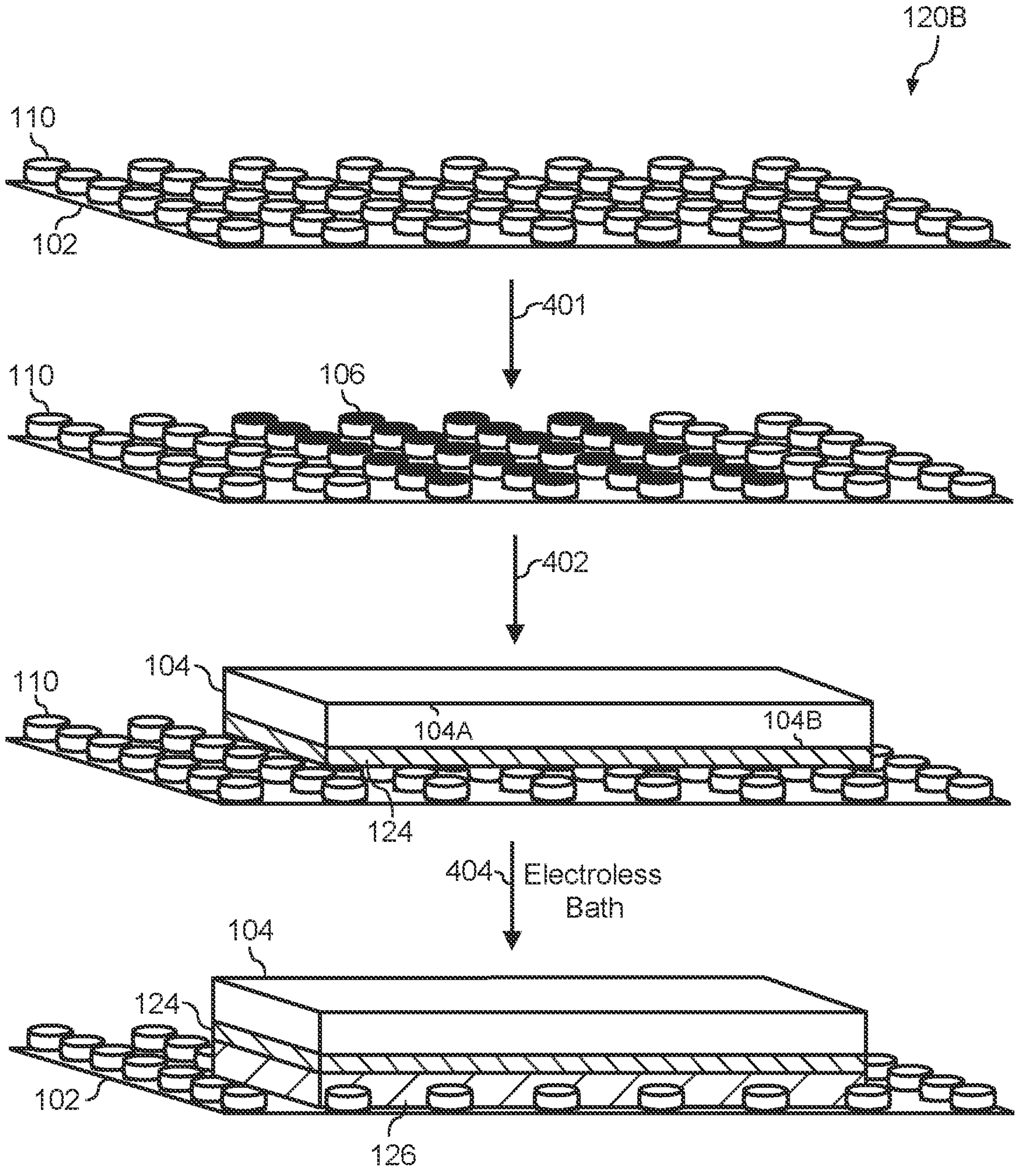

FIGS. 11A-11C depict aspects of an electroless deposition process according to example embodiments of the present disclosure. More particularly, FIG. 11A depicts the example electroless die-attach method 400 for attaching a semiconductor die 104 to a submount 102 having the example configuration 116B depicted in FIG. 5. Furthermore, FIG. 11B depicts the example electroless die-attach method 400 for attaching a semiconductor die 104 to a submount 102 having the example configuration 118B depicted in FIG. 5. Finally, FIG. 11C depicts the example electroless die-attach method 400 for attaching a semiconductor die 104 to a submount 102 having the example configuration 120B depicted in FIG. 5. It should be appreciated that FIGS. 11A-11C depict example configurations 116B, 118B, 120B for purposes of illustration and discussion.

Referring to FIGS. 11A-11C, as represented by arrow 401, an adhesion layer (e.g., die-attach material 106) may be deposited on a surface (e.g., planar surface 112) of the at least one stud protrusion 110. More particularly, the adhesion layer may be deposited on a surface of the at least one stud protrusion 110 that will be facing the semiconductor die 104 to which the submount 102 will be attached. The adhesion layer may include, for instance, a conductive material to facilitate adhesion of a conductive catalytic layer 124 and/or an electroless deposited material 126 to the submount 102. The adhesion layer may also act as a diffusion barrier. In some examples, the adhesion layer includes titanium. In some examples, the adhesion layer may have a thickness, for instance, in a range of about 25 nm to about 100 nm. The adhesion layer may be deposited on the at least one stud protrusion 110 using any suitable deposition process, such as a sputtering, evaporation, etc.

Referring still to FIGS. 11A-11C, as represented by arrow 402, a catalytic layer 124 may be deposited on a bottom surface 104B of the semiconductor die 104. The catalytic layer 124 provides an active layer to facilitate initiation of electroless deposition of an electroless deposited material 126. In some embodiments, the catalytic layer 124 includes gold (Au), palladium (Pd), nickel (Ni), or aluminum (Al). The catalytic layer 124 may be an alloy containing gold (Au), palladium (Pd), nickel (Ni), or aluminum (Al) with other elements. For instance, the catalytic layer 124 may be a gold alloy, palladium alloy, nickel alloy, or aluminum alloy. In some examples, the catalytic layer 124 may have a thickness, for instance, in a range of about 25 nm to about 100 nm. The catalytic layer 124 may be deposited on the semiconductor die 104 using any suitable deposition process, such as sputtering, evaporation, etc.

Referring to FIG. 10 at (404), performing the electroless deposition process at (402) may further include placing the submount and the semiconductor die at least partially in an electroless bath. An electroless bath may include a metal ion source, a reducing agent, and/or a complexing agent (e.g., chelating agent). The electroless bath may include additives as stabilizers also to tune the properties of the deposit. The pH and temperature may also be adjusted.

Examples of a metal ion source, such as a copper metal ion source, are cupric salts, such as sulfate (CuSO4), chloride (CuCl2) or nitrate (Cu(NO3)2). Example reducing agents may include borohydride (e.g., $NaBH_4$), formaldehyde ($CH_2O$), hypophosphite (e.g., $NaPO_2H_2$), hydrazine ($N_2H_4$), dimethylamine borane ($C_2H_7BN$), and dithionite (e.g., $NaHSO_3$). Example complexing/chelating agents may include tartrate salts such as sodium tartrate ($C_4H_4Na_2O_6$), ethylenediamine tetraacetic acid (EDTA), alkanol amines, such as quadrol (N,N,N',N'-tetrakis(2-hydroxypropyl)ethylenediamine), glycolic acids and other amines are examples of a complexing/chelating agents. Example additives may include 2-mercaptobenzothiazole (C7H5NS2), diethyldithiocarbamate (5H10NS2), 2,2'-dipyridyl ($C_{10}H_8N_2$), polyethylene glycol, vanadium pentoxide (V2O5), nickel chloride (NiCl2), potassium ferrocyanide ($K_4[Fe(CN)6]$). Plating rate and thickness may be tuned via different bath formulations.

More particularly, following the electroless deposition process at (402), the submount may be at least temporarily bonded to the semiconductor die. As such, the submount with the temporarily bonded semiconductor die may be placed in an electroless bath to deposit an electroless deposited portion between at least a portion of the semiconductor die and the submount. In some embodiments, the electroless deposited material may at least partially fill a space between adjacent stud protrusions on the submount. More specifically, an electroless deposited material (e.g., copper and/or nickel) may grow in the space between adjacent stud protrusions on the submount while the semiconductor die and the submount are in the electroless bath. As discussed below, in some embodiments, the electroless deposited material may grow in a direction toward the semiconductor die from the base plane defined by the submount. Alternatively, in other embodiments, the electroless deposited material may grow in a direction toward the submount from the semiconductor die.

Referring again to FIGS. 11A-11C, as represented by arrow 404, the electroless deposited material 126 may be deposited between at least a portion of the semiconductor die 104 and the submount 102. More particularly, FIGS. 11A-11C depict the semiconductor package 100 of FIG. 1 after the electroless deposition process represented by arrow 404 (e.g., placing in an electroless bath). As shown, the electroless deposited material 126 may fill the space between adjacent stud protrusions 110 on the submount. In this manner, the electroless deposited material 126 may grow in a direction from the bottom surface 104B of the semiconductor die 104 (e.g., from the catalytic layer 124) to the submount 102.

Figure 12:
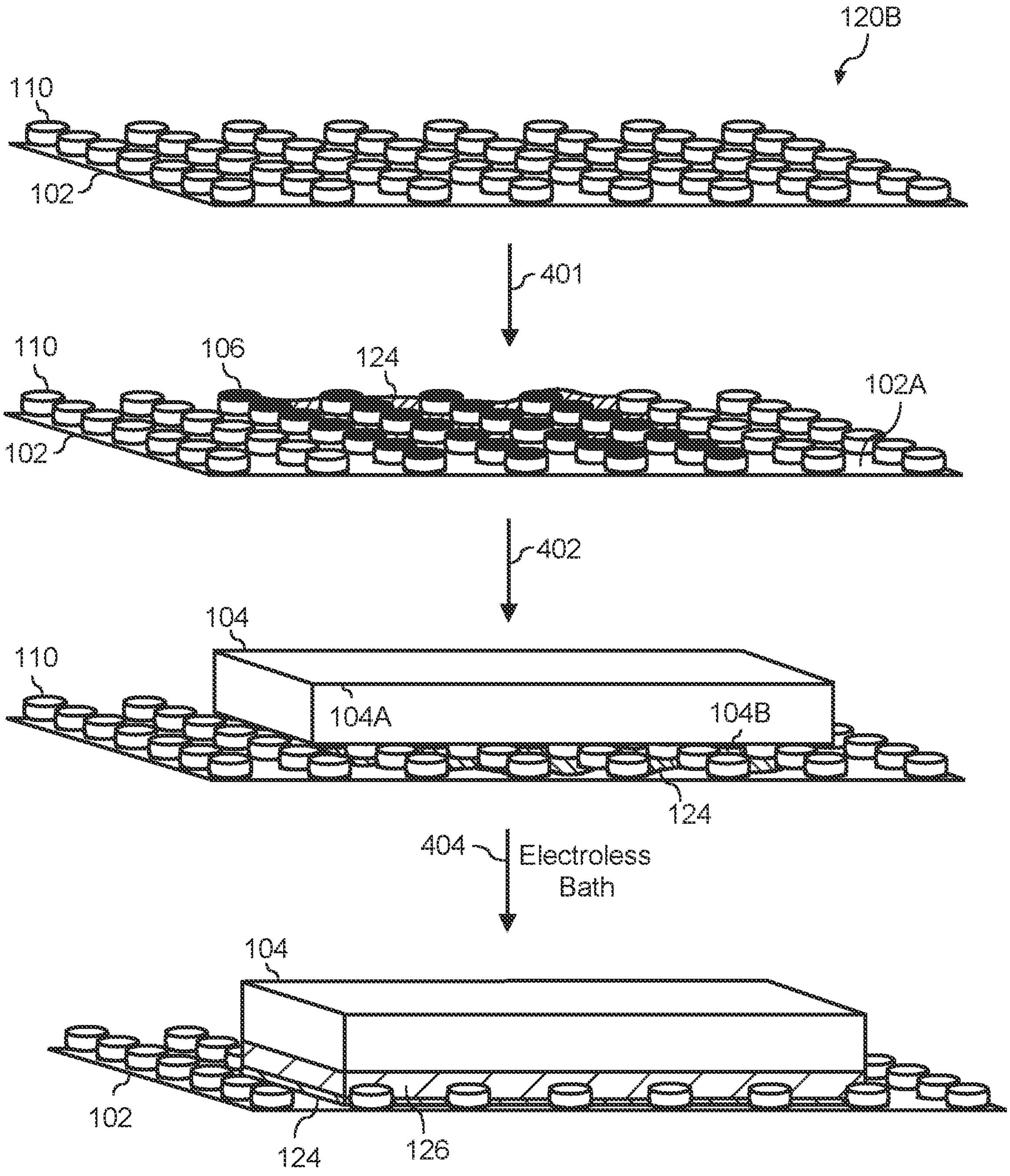
FIG. 12 depicts an illustrative example of the example method of FIG. 10 according to example embodiments of the present disclosure.

FIG. 12 depicts aspects of an electroless deposition process according to example embodiments of the present disclosure. More particularly, FIG. 12 depicts the example electroless die-attach method 400 for attaching a semiconductor die 104 to a submount 102 having the example configuration 120B depicted in FIG. 5. The electroless die-attach process of FIG. 12 is similar to the electroless die-attach process depicted in FIGS. 11A-11C, except that the catalytic layer 124 is deposited on the top surface 102A of the submount 102 instead of on the bottom surface 104B of the semiconductor die 104 (FIG. 11C).

For instance, as represented by arrow 401 on FIG. 12, the adhesion layer (e.g., die-attach material 106) may be deposited on a surface (e.g., planar surface 112) of the at least one stud protrusion 110. More particularly, the adhesion layer may be deposited on a surface of the at least one stud protrusion 110 that will be facing the semiconductor die 104 to which the submount 102 will be attached. Furthermore, the catalytic layer 124 may be deposited on the top surface 102A of the submount 102. More particularly, the catalytic layer 124 may be deposited at least partially between adjacent stud protrusions 110. As such, following the electroless bath (e.g., represented by arrow 404), the electroless deposited material 126 may still be deposited between at least a portion of the semiconductor die 104 and the submount 102. However, in FIG. 12, the electroless deposited material 126 may grow in a direction toward the bottom surface 104B of the semiconductor die 104 from the submount 102.

It should be noted that the example electroless die-attach processes depicted in FIGS. 11A-11C and FIG. 12 are for purposes of illustration and discussion. Although depicted as being disposed on specific surfaces in FIGS. 11A-11C and FIG. 12, it should be understood that adhesion layer (e.g., die-attach material 106) and the catalytic layer 124 can be deposited on any combination of surfaces without deviating from the scope of the present disclosure. For instance, in some embodiments (e.g., FIG. 12), both the adhesion layer and the catalytic layer 124 may be deposited on a surface of the submount 102. Alternatively, in other embodiments, both the adhesion layer and the catalytic layer 124 may be deposited on a surface of the semiconductor die 104. Additionally and/or alternatively, in other embodiments (e.g., FIGS. 11A-11C), the adhesion layer may be deposited on a surface of the submount 102 and the catalytic layer 124 may be deposited on a surface of the semiconductor die 104. Alternatively, in other embodiments, the adhesion layer may be deposited on a surface of the semiconductor die 104 and the catalytic layer 124 may be deposited on a surface of the submount 102.

Referring again to FIG. 7 at (206), the method 200 may include forming an encapsulating material on the semiconductor die. As will be discussed in greater detail below, an encapsulating material may fill the space around the semiconductor die and the submount to form an encapsulating portion of the semiconductor die and the submount.

Figure 13A:
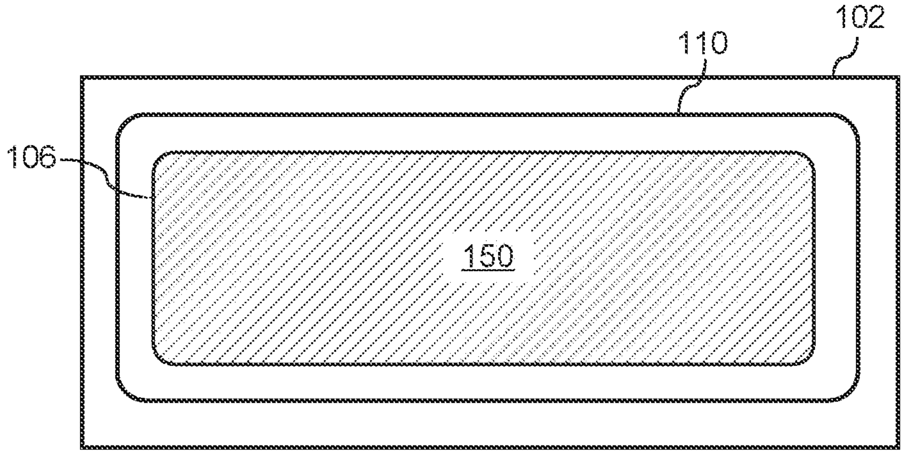
FIGS. 13A-13B depict top views of example annular stud protrusions on an example submount according to example embodiments of the present disclosure.
Figure 13B:
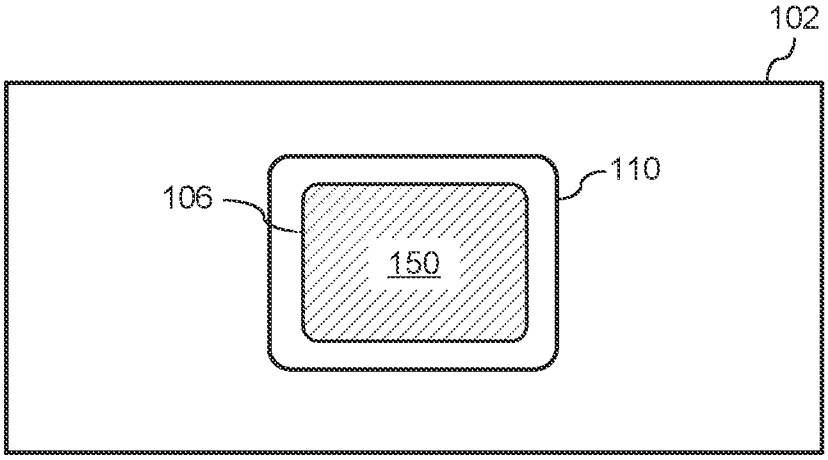

Referring now to FIGS. 13A-13B, a cross-sectional top view of the example submount 102 with an annular stud protrusion 110 is depicted. As noted above, the stud protrusions disclosed herein may include an annular stud protrusion 110 in a peripheral portion of the submount 102 (FIG. 13A). Additionally and/or alternatively, the stud protrusions disclosed herein may include an annular stud protrusion 110 in a center portion of the submount 102 (FIG. 13B). It should be appreciated that the annular stud protrusions 110 may be in any suitable portion of the submount 102 without deviating from the scope of the present disclosure.

As shown in FIGS. 13A-13B, the annular stud protrusion 110 may define an interior portion 150. More particularly, the interior portion 150 may be the portions of the submount 102 bounded by the annular stud protrusion 110.

As discussed above, the semiconductor die 104 may be disposed on the stud protrusion 110 and may be attached to the submount 102 using die-attach material 106. More particularly, in FIG. 13A, a peripheral portion of the semiconductor die 104 may be on the annular stud protrusion 110, and the die-attach material 106 may fill the interior portion 150. Additionally and/or alternatively, in FIG. 13B, a center portion of the semiconductor die 104 may be on the annular stud protrusion 110, and the die-attach material 106 may fill the interior portion 150. It should be noted that the die-attach material 106 may be any suitable material such as, e.g., sintered die-attach material and/or electroless die-attach material.

Figure 14:
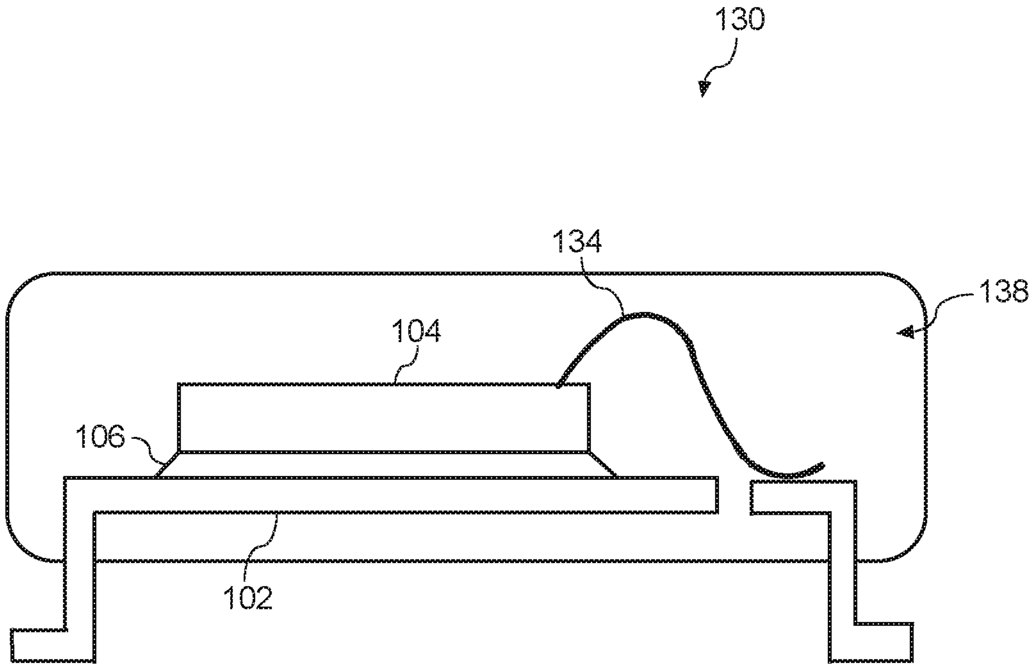
FIG. 14 depicts an example semiconductor package according to example embodiments of the present disclosure.

FIG. 14 depicts an example semiconductor package 130 including a semiconductor die attached to a submount according to example embodiments of the present disclosure. As shown, semiconductor package 130 may include the submount 102, semiconductor die 104, and die-attach material 106 as discussed above with reference to FIGS. 1-13. FIG. 14 is provided for purposes of illustration and discussion. Those of ordinary skill in the art, using the disclosures provided herein, will understand that aspects of the present disclosure may be used in a variety of devices and/or applications without deviating from the scope of the present disclosure.

The semiconductor package 130 may be, for instance, a discrete semiconductor package. The semiconductor package 130 may include the conductive submount 102 (e.g., a patterned conductive substrate) on which a semiconductor die 104 containing one or more power devices (e.g., transistors, diodes, etc.) is attached using the die-attach material 106 according to example embodiments of the present disclosure. The die-attach material 106 may provide a thermal, mechanical, and electrical connection between the semiconductor die 104 and the conductive submount 102. In some embodiments, the semiconductor die 104 may also be connected to the conductive submount 102 using wire bonds 134. An encapsulating material 138 (e.g., epoxy mold compound) may fill the space around the semiconductor die 104 and the submount 102.

Example aspects of the present disclosure are set forth below. Any of the below features or examples may be used in combination with any of the embodiments or features provided in the present disclosure.

One example embodiment of the present disclosure is directed to a semiconductor package. The semiconductor package comprises a submount and a semiconductor die on the submount. The submount defines a base plane and comprises at least one stud protrusion extending from the base plane in a direction toward the semiconductor die.

In some examples, the semiconductor die is directly on the at least one stud protrusion.

In some examples, the at least one stud protrusion has a planar surface. In some examples, the semiconductor die is on the planar surface of the at least one stud protrusion.

In some examples, a surface area of the planar surface is less than about 10% of a surface area of the base plane defined by the submount. In some examples, a surface area of the planar surface is less than about 5% of a surface area of the base plane defined by the submount.

In some examples, the planar surface of the at least one stud protrusion comprises a circular cross-section. In some examples, the planar surface of the at least one stud protrusion comprises a square cross-section.

In some examples, the submount comprises at least one stud protrusion in a center portion of the submount. In some examples, the submount comprises at least one stud protrusion in a peripheral portion of the submount.

In some examples, the submount comprises a plurality of stud protrusions. In some examples, the semiconductor package comprises at least one stud protrusion of the plurality of stud protrusions in a center portion of the submount and at least one stud protrusion of the plurality of stud protrusions in a peripheral portion of the submount.

In some examples, the at least one stud protrusion comprises at least one punch-defined stud protrusion.

In some examples, the at least one stud protrusion is integral with the submount.

In some examples, the at least one stud protrusion has a height in a range of about 1 micron to about 20 microns.

In some examples, the semiconductor package has a bond line thickness (BLT) that is substantially equal to a height of the at least one stud protrusion. In some examples, the BLT is in a range of about 1 micron to about 20 microns.

In some examples, the at least one stud protrusion comprises a plurality of stud protrusions arranged in an array on the submount.

In some examples, the at least one stud protrusion comprises an annular stud protrusion. In some examples, the annular stud protrusion is in a center portion of the submount.

In some examples, the semiconductor package further comprises a die-attach material between at least a portion of the semiconductor die and the submount. In some examples, the die-attach material at least partially fills a space between adjacent stud protrusions on the submount.

In some examples, the die-attach material comprises a sintered material. In some examples, the sintered material comprises sintered silver or sintered copper.

In some examples, the semiconductor package further comprises an electroless deposited material between at least a portion of the semiconductor die and the submount. In some examples, the electroless deposited material at least partially fills a space between adjacent stud protrusions on the submount. In some examples, the electroless deposited material comprises copper. In some examples, the electroless deposited material comprises nickel.

In some examples, the semiconductor package further comprises a conductive catalytic layer. In some examples, the conductive catalytic layer is on the semiconductor die. In some examples, the conductive catalytic layer is on the submount. In some examples, the conductive catalytic layer comprises at least one of gold, palladium, nickel, or aluminum.

In some examples, the submount comprises a lead frame.

In some examples, the submount comprises copper.

In some examples, the semiconductor die comprises a wide bandgap semiconductor device.

In some examples, the wide bandgap semiconductor device comprises a silicon carbide-based MOSFET, a silicon carbide-based Schottky diode, or a Group III nitride-based high electron mobility transistor.

Another example embodiment of the present disclosure is directed to a semiconductor package. The semiconductor package includes a semiconductor die, a submount defining a base plane, a die-attach material coupling the semiconductor die to the submount, and an encapsulating portion of the semiconductor die. The semiconductor die includes a wide bandgap semiconductor device. The submount includes a plurality of stud protrusions extending from the base plane in a direction toward the semiconductor die.

In some examples, the plurality of stud protrusions are arranged in an array.

In some examples, each of the plurality of stud protrusions has a planar surface, and a surface area of the planar surface is less than about 10% of a surface area of the base plane defined by the submount. In some examples, the planar surface comprises a circular cross-section. In some examples, the planar surface comprises a square cross-section.

In some examples, at least one of the plurality of stud protrusions is arranged in a center portion of the submount. In some examples, at least one of the plurality of stud protrusions is arranged in a peripheral portion of the submount.

In some examples, each of the plurality of stud protrusions has a height in a range of about 1 micron to about 20 microns.

In some examples, the semiconductor package has a bond line thickness (BLT) that is substantially equal to a height of the plurality of stud protrusions. In some examples, the BLT is in a range of about 1 micron to about 20 microns.

In some examples, the die-attach material fills a space between the plurality of stud protrusions.

In some examples, the die-attach material comprises a sintered material.

In some examples, the die-attach material comprises an electroless deposited material. In some examples, the semiconductor package further comprises a conductive catalytic layer on the semiconductor die or on the submount. In some examples, the conductive catalytic layer comprises at least one of gold, palladium, nickel, or aluminum.

In some examples, the submount comprises a lead frame.

In some examples, the submount comprises copper.

In some examples, the semiconductor die comprises silicon carbide or a Group III nitride. In some examples, the wide bandgap semiconductor device comprises a silicon carbide-based MOSFET, a silicon carbide-based Schottky diode, or a Group III nitride-based high electron mobility transistor.

Another example embodiment of the present disclosure is directed to a submount. The submount includes a surface defining a base plane and at least one stud protrusion. The at least one stud protrusions extends from the base plane.

In some examples, the at least one stud protrusion has a planar surface. In some examples, a surface area of the planar surface is less than about 10% of a surface area of the base plane defined by the submount. In some examples, a surface area of the planar surface is less than about 5% of a surface area of the base plane defined by the submount. In some examples, the planar surface of the at least one stud protrusion comprises a circular cross-section. In some examples, the planar surface of the at least one stud protrusion comprises a square cross-section.

In some examples, at least one stud protrusion is in a center portion of the submount.

In some examples, at least one stud protrusion is in a peripheral portion of the submount.

In some examples, the at least one stud protrusion comprises at least one punch-defined stud protrusion.

In some examples, the at least one stud protrusion is integral with the submount.

In some examples, the at least one stud protrusion has a height in a range of about 1 micron to about 20 microns.

In some examples, the at least one stud protrusion comprises a plurality of stud protrusions arranged in an array on the submount.

In some examples, the at least one stud protrusion comprises an annular stud protrusion. In some examples, the annular stud protrusion is in a peripheral portion of the submount. In some examples, the annular stud protrusion is in a center portion of the submount.

In some examples, the submount comprises copper.

Another example embodiment of the present disclosure is directed to a method. The method includes placing a semiconductor die on at least one stud protrusion of a submount. The submount defines a base plane.

In some examples, the at least one stud protrusion extends from the base plane in a direction toward the semiconductor die.

In some examples, the method further comprises attaching the semiconductor die to the submount with a die-attach material.

In some examples, attaching the semiconductor die to the submount comprises at least partially filling a space between adjacent stud protrusions with die-attach material and sintering the die-attach material.

In some examples, the die-attach material comprises sintered silver or sintered copper.

In some examples, attaching the semiconductor die to the submount with a die-attach material comprises performing an electroless deposition process to deposit an electroless deposited material to attach the semiconductor die to the submount.

In some examples, performing an electroless deposition process comprises depositing a catalytic layer on the submount and depositing the electroless deposited material on the catalytic layer. In some examples, performing an electroless deposition process comprises depositing a catalytic layer on the semiconductor die and depositing the electroless deposited material on the catalytic layer.

In some examples, performing an electroless deposition process comprises placing the submount and the semiconductor die at least partially in an electroless bath. In some examples, the electroless bath comprises a metal ion source and a reducing agent. In some examples, the electroless bath comprises a complexing agent and a stabilizer.

In some examples, the at least one stud protrusion comprises a plurality of stud protrusions arranged in an array.

In some examples, the at least one stud protrusion has a planar surface, and a surface area of the planar surface is less than about 10% of a surface area of the base plane.

In some examples, the planar surface of the at least one stud protrusion comprises a circular cross-section. In some examples, the planar surface of the at least one stud protrusion comprises a square cross-section.

In some examples, the submount comprises at least one stud protrusion in a center portion of the submount.

In some examples, the submount comprises at least one stud protrusion in a peripheral portion of the submount.

In some examples, the at least one stud protrusion has a height in a range of about 1 microns to about 20 microns.

In some examples, the submount comprises a lead frame.

In some examples, the submount comprises copper.

In some examples, the semiconductor die comprises silicon carbide or a Group III nitride. In some examples, the semiconductor die comprises a silicon carbide-based MOSFET, a silicon carbide-based Schottky diode, or a Group III nitride-based high electron mobility transistor.

In some examples, the method further includes forming an encapsulating material on the semiconductor die.

Another example embodiment of the present disclosure is directed to a semiconductor package. The semiconductor package includes a submount and a semiconductor die on the submount. The semiconductor die includes at least one stud protrusion extending from the semiconductor die in a direction toward the submount.

In some examples, the submount directly contacts the at least one stud protrusion.

In some examples, the at least one stud protrusion has a planar surface, and the submount contacts the planar surface of the at least one stud protrusion. In some examples, a surface area of the planar surface is less than about 10% of a surface area of the submount. In some examples, a surface area of the planar surface is less than about 5% of a surface area of the submount.

In some examples, the planar surface of the at least one stud protrusion comprises a circular cross-section. In some examples, the planar surface of the at least one stud protrusion comprises a square cross-section.

In some examples, the semiconductor die comprises at least one stud protrusion in a center portion of the semiconductor die. In some examples, the semiconductor die comprises at least one stud protrusion in a peripheral portion of the semiconductor die.

In some examples, the semiconductor die comprises a plurality of stud protrusions, and the semiconductor package further comprises at least one stud protrusion of the plurality of stud protrusions in a center portion of the semiconductor die and at least one stud protrusion of the plurality of stud protrusions in a peripheral portion of the semiconductor die.

In some examples, the at least one stud protrusion has a height in a range of about 1 micron to about 20 microns.

In some examples, the semiconductor package has a bond line thickness (BLT) that is substantially equal to a height of the at least one stud protrusion. In some examples, the BLT is in a range of about 1 micron to about 20 microns.

In some examples, the at least one stud protrusion comprises a plurality of stud protrusions arranged in an array on the semiconductor die.

In some examples, the at least one stud protrusion comprises an annular stud protrusion.

In some examples, the semiconductor package further comprises a die-attach material between at least a portion of the semiconductor die and the submount. In some examples, the die-attach material at least partially fills a space between adjacent stud protrusions on the semiconductor die. In some examples, the die-attach material comprises a sintered material. In some examples, the sintered material comprises sintered silver or sintered copper.

In some examples, the semiconductor package further comprises an electroless deposited material between at least a portion of the semiconductor die and the submount. In some examples, the electroless deposited material at least partially fills a space between adjacent stud protrusions on the semiconductor die. In some examples, the electroless deposited material comprises copper. In some examples, the electroless deposited material comprises nickel.

In some examples, the semiconductor package further comprises a conductive catalytic layer. In some examples, the conductive catalytic layer is on the semiconductor die. In some examples, the conductive catalytic layer is on the submount.

In some examples, the conductive catalytic layer comprises at least one of gold, palladium, nickel, or aluminum.

In some examples, the submount comprises a lead frame.

In some examples, the submount comprises copper.

In some examples, the semiconductor die comprises a wide bandgap semiconductor device. In some examples, the wide bandgap semiconductor device comprises a silicon carbide-based MOSFET, a silicon carbide-based Schottky diode, or a Group III nitride-based high electron mobility transistor.

While the present subject matter has been described in detail with respect to specific example embodiments thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A semiconductor package, comprising:

a submount; and a semiconductor die on the submount, wherein the submount defines a base plane, wherein the submount comprises at least one stud protrusion extending from the base plane in a direction toward the semiconductor die, and wherein the at least one stud protrusion is integral with the submount, and the semiconductor package has a bond line thickness (BLT) that is substantially equal to a height of the at least one stud protrusion.

2. The semiconductor package of claim 1, wherein the at least one stud protrusion has a planar surface, the semiconductor die being on the planar surface of the at least one stud protrusion.

3. The semiconductor package of claim 2, wherein a surface area of the planar surface is less than about 10% of a surface area of the base plane defined by the submount.

4. The semiconductor package of claim 2, wherein the planar surface of the at least one stud protrusion comprises a circular cross-section or a square cross-section.

5. The semiconductor package of claim 1, wherein the submount comprises a plurality of stud protrusions, the semiconductor package further comprising:

at least one stud protrusion of the plurality of stud protrusions in a center portion of the submount; and at least one stud protrusion of the plurality of stud protrusions in a peripheral portion of the submount.

6. The semiconductor package of claim 1, wherein the at least one stud protrusion comprises at least one punch-defined stud protrusion.

7. The semiconductor package of claim 1, wherein the at least one stud protrusion has a height in a range of about 1 micron to about 20 microns.

8. The semiconductor package of claim 1, wherein the at least one stud protrusion comprises an annular stud protrusion.

9. The semiconductor package of claim 1, further comprising a die-attach material between at least a portion of the semiconductor die and the submount, the die-attach material at least partially filling a space between adjacent stud protrusions on the submount.

10. The semiconductor package of claim 1, further comprising an electroless deposited material between at least a portion of the semiconductor die and the submount, the electroless deposited material at least partially filling a space between adjacent stud protrusions on the submount.

11. The semiconductor package of claim 10, further comprising a conductive catalytic layer.

12. The semiconductor package of claim 11, wherein the conductive catalytic layer is on the semiconductor die.

13. The semiconductor package of claim 11, wherein the conductive catalytic layer is on the submount.

14. The semiconductor package of claim 1, wherein the submount comprises a lead frame.

15. The semiconductor package of claim 1, wherein the semiconductor die comprises a wide bandgap semiconductor device.

16. The semiconductor package of claim 15, wherein the wide bandgap semiconductor device comprises a silicon carbide-based MOSFET, a silicon carbide-based Schottky diode, or a Group III nitride-based high electron mobility transistor.

17. A submount, comprising:

a surface defining a base plane; and at least one stud protrusion comprising a planar surface that is less than about 10% of a surface area of the base plane defined by the submount, wherein the at least one stud protrusion extends from a base plane, wherein the at least one stud protrusion is integral with the submount.

18. A semiconductor package, comprising:

a submount; and a semiconductor die on the submount, wherein the submount defines a base plane, wherein the submount comprises at least one stud protrusion extending from the base plane in a direction toward the semiconductor die, the at least one stud protrusion having a planar surface that is less than about 10% of a surface area of the base plane defined by the submount.

19. The semiconductor package of claim 18, wherein the submount comprises a plurality of stud protrusions extending from the base plane in the direction toward the semiconductor die.

20. The semiconductor package of claim 19, wherein the submount comprises at least twenty-seven stud protrusions.

21. The submount of claim 17, wherein a surface area of the planar surface is less than about 5% of a surface area of the base plane defined by the submount.

22. The submount of claim 17, wherein the planar surface of the at least one stud protrusion comprises a circular cross-section.

23. The submount of claim 17, wherein the planar surface of the at least one stud protrusion comprises a square cross-section.

24. The submount of claim 17, wherein the at least one stud protrusion is in a center portion of the submount.

25. The submount of claim 17, wherein the at least one stud protrusion is in a peripheral portion of the submount.

26. The submount of claim 17, wherein the at least one stud protrusion comprises at least one punch-defined stud protrusion.

27. The submount of claim 17, wherein the at least one stud protrusion has a height in a range of about 1 micron to 20 microns.

28. The submount of claim 17, wherein the at least one stud protrusion comprises a plurality of stud protrusions arranged in an array of the submount.

29. The submount of claim 17, wherein the at least one stud protrusion comprises an annular stud protrusion.

30. The submount of claim 29, wherein the at least one stud protrusion is in a peripheral portion of the submount.

31. The submount of claim 29, wherein the at least one stud protrusion is in a center portion of the submount.

32. The submount of claim 17, wherein the submount comprises copper.

* * * * *